(12) United States Patent
Lee et al.

(10) Patent No.: US 11,888,289 B2
(45) Date of Patent: Jan. 30, 2024

(54) LIGHT SOURCE MODULE ALLOWING DIFFERENTIAL CONTROL ACCORDING TO DISTANCE TO SUBJECT AND METHOD FOR CONTROLLING THE SAME

(71) Applicant: Namuga, Co., Ltd., Gyeonggi-do (KR)

(72) Inventors: Jun Youb Lee, Gyeonggi-do (KR); Young Gyu Kang, Gyeonggi-do (KR); Jeong Hwa Seo, Gyeonggi-do (KR)

(73) Assignee: Namuga, Co., Ltd., Gyeonggi-do (KR)

( * ) Notice: Subject to any disclaimer, the term of this patent is extended or adjusted under 35 U.S.C. 154(b) by 505 days.

(21) Appl. No.: 17/105,726

(22) Filed: Nov. 27, 2020

(65) Prior Publication Data

US 2021/0305777 A1 Sep. 30, 2021

(30) Foreign Application Priority Data

Mar. 30, 2020 (KR) .......................... 10-2020-0038379
Apr. 17, 2020 (KR) .......................... 10-2020-0046634
(Continued)

(51) Int. Cl.
*H01S 5/00* (2006.01)
*G02B 3/00* (2006.01)
(Continued)

(52) U.S. Cl.
CPC ............ *H01S 5/0651* (2013.01); *H01S 5/005* (2013.01); *H01S 5/0265* (2013.01);
(Continued)

(58) Field of Classification Search
CPC ...... H01S 5/0651; H01S 5/005; H01S 5/0265; H01S 5/0607; H01S 5/0683;
(Continued)

(56) References Cited

U.S. PATENT DOCUMENTS 7,359,120 B1 * 4/2008 Raymond .............. G02B 30/27
40/454
8,965,189 B2 2/2015 Kang et al.
(Continued)

FOREIGN PATENT DOCUMENTS

JP 08021872 A 1/1996
JP 09-096510 A 4/1997
(Continued)

OTHER PUBLICATIONS

Office Action issued in Korean Patent Application No. 10-2020-0125947 dated Feb. 11, 2021, pp. 5.
(Continued)

*Primary Examiner* — Xinning(Tom) Niu

(74) *Attorney, Agent, or Firm* — FisherBroyles, LLP; Susan M. Oiler

(57) ABSTRACT

One embodiment may provide a light source module including: a light source part including at least one vertical cavity surface-emitting laser, which is configured to transfer light through N (N being a natural number equal to or greater than 1) apertures; at least one collimator lens through which light emitted from the light source part passes; and a driving device configured to make the collimator lens move, wherein the at least one vertical cavity surface-emitting laser comprises divided regions, and an intensity of a beam is controlled according to a predetermined far-distance mode or near-distance mode.

18 Claims, 33 Drawing Sheets

(30) Foreign Application Priority Data

| | | |
|---|---|---|
| May 11, 2020 | (KR) | 10-2020-0055789 |
| May 11, 2020 | (KR) | 10-2020-0055790 |
| May 11, 2020 | (KR) | 10-2020-0055791 |
| Jun. 3, 2020 | (KR) | 10-2020-0066785 |
| Sep. 28, 2020 | (KR) | 10-2020-0125935 |
| Sep. 28, 2020 | (KR) | 10-2020-0125947 |
| Sep. 29, 2020 | (KR) | 10-2020-0126458 |
| Oct. 16, 2020 | (KR) | 10-2020-0134149 |
| Oct. 19, 2020 | (KR) | 10-2020-0134976 |

(51) Int. Cl.

| | |
|---|---|
| *H01S 5/065* | (2006.01) |
| *H01S 5/06* | (2006.01) |
| *H01S 5/0683* | (2006.01) |
| *H01S 5/026* | (2006.01) |
| *H01S 5/183* | (2006.01) |
| *G01S 7/484* | (2006.01) |
| *G01S 7/481* | (2006.01) |
| *H01S 5/42* | (2006.01) |

(52) U.S. Cl.
CPC ......... *H01S 5/0607* (2013.01); *H01S 5/0683* (2013.01); *H01S 5/18302* (2013.01); *H01S 5/18388* (2013.01); *G01S 7/484* (2013.01); *G01S 7/4815* (2013.01); *G02B 3/0043* (2013.01); *H01S 5/423* (2013.01)

(58) Field of Classification Search
CPC .. H01S 5/18302; H01S 5/18388; H01S 5/423; G01S 7/4815; G01S 7/484; G01S 7/497; G01S 7/4817; G01S 17/08; G02B 3/0043; G02B 19/0057; G02B 19/0066; G02B 26/0875; G02B 7/00; G02B 27/30; G02B 27/4233
See application file for complete search history.

(56) References Cited

U.S. PATENT DOCUMENTS

| | | | |
|---|---|---|---|
| 9,645,474 B2 | 5/2017 | Kim | |
| 10,066,986 B2* | 9/2018 | Lipson | G01J 1/0411 |
| 10,165,162 B2 | 12/2018 | Eromaki | |
| 2007/0267629 A1* | 11/2007 | Kwak | H10K 71/18 257/40 |
| 2011/0298763 A1* | 12/2011 | Mahajan | G09G 3/025 345/1.3 |
| 2016/0173757 A1 | 6/2016 | Choi et al. | |
| 2017/0123053 A1 | 5/2017 | Stigwall et al. | |
| 2017/0264814 A1 | 9/2017 | Park et al. | |
| 2017/0343831 A1* | 11/2017 | Bakin | G02B 27/0012 |
| 2018/0180722 A1* | 6/2018 | Pei | G01S 7/497 |
| 2019/0251699 A1* | 8/2019 | Chih | G06V 20/10 |
| 2020/0218082 A1 | 7/2020 | Choi et al. | |

FOREIGN PATENT DOCUMENTS

| | | | | |
|---|---|---|---|---|
| JP | 10-22763 A | | 8/1998 | |
| JP | 2002250970 A | | 9/2002 | |
| JP | 2003-528324 A | | 9/2003 | |
| JP | 2011-075899 A | | 4/2011 | |
| JP | 5066366 B2 | | 11/2012 | |
| KR | 10-0649641 B1 | | 11/2006 | |
| KR | 100649641 B1 | | 11/2006 | |
| KR | 20140145481 A | | 12/2014 | |
| KR | 10-1538395 B1 | | 7/2015 | |
| KR | 101538395 B1 | | 7/2015 | |
| KR | 20160069137 A | * | 6/2016 | ......... A61N 1/36014 |
| KR | 10-2017-0065951 A | | 6/2017 | |
| KR | 10-1742500 B1 | | 6/2017 | |
| KR | 10-1742501 B1 | | 6/2017 | |
| KR | 10-1750751 B1 | | 7/2017 | |
| KR | 10-1853268 B1 | | 5/2018 | |
| KR | 10-1877039 B1 | | 7/2018 | |
| KR | 20190067641 A | | 6/2019 | |
| KR | 20190130468 A | | 11/2019 | |
| KR | 10-2053935 B1 | | 12/2019 | |
| KR | 10-2020-0004757 A | | 1/2020 | |
| KR | 10-2020-0014201 A | | 2/2020 | |
| KR | 20200016604 A | | 2/2020 | |
| KR | 10-2020-0032429 A | | 3/2020 | |
| KR | 10-2020-0033168 A | | 3/2020 | |
| KR | 10-2087519 B1 | | 3/2020 | |
| KR | 10-2090826 B1 | | 3/2020 | |
| KR | 10-2090827 B1 | | 3/2020 | |
| KR | 10-2020-0046267 A | | 5/2020 | |
| KR | 10-2020-0107749 A | | 9/2020 | |
| KR | 10-2020-0117187 A | | 10/2020 | |
| WO | 2018092873 A1 | | 5/2018 | |
| WO | 2019/043102 A1 | | 3/2019 | |
| WO | 2019043102 A1 | | 3/2019 | |
| WO | 2018092873 A1 | | 10/2019 | |

OTHER PUBLICATIONS

Office Action issued in Korean Patent Application No. 10-2020-0125935 dated Jul. 15, 2021, pp. 5.

Office Action issued in Korean Patent Application No. 10-2020-0126458 dated Jul. 21, 2021, pp. 5.

Office Action issued in Korean Patent Application No. 10-2022-0041040, dated Jun. 30, 2022, pp. 4.

Office Action issued in Korean Patent Application No. 10-2020-0134149 dated Apr. 5, 2022, pp. 7.

Office Action issued in Korean Patent Application No. 10-2020-0134976 dated Apr. 5, 2022, pp. 6.

* cited by examiner

FIG. 7
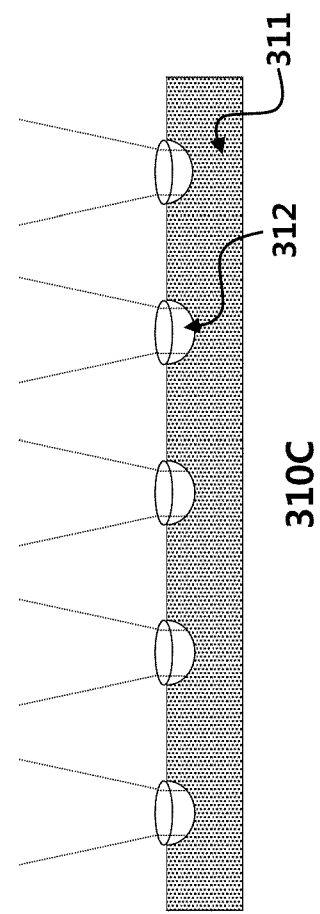
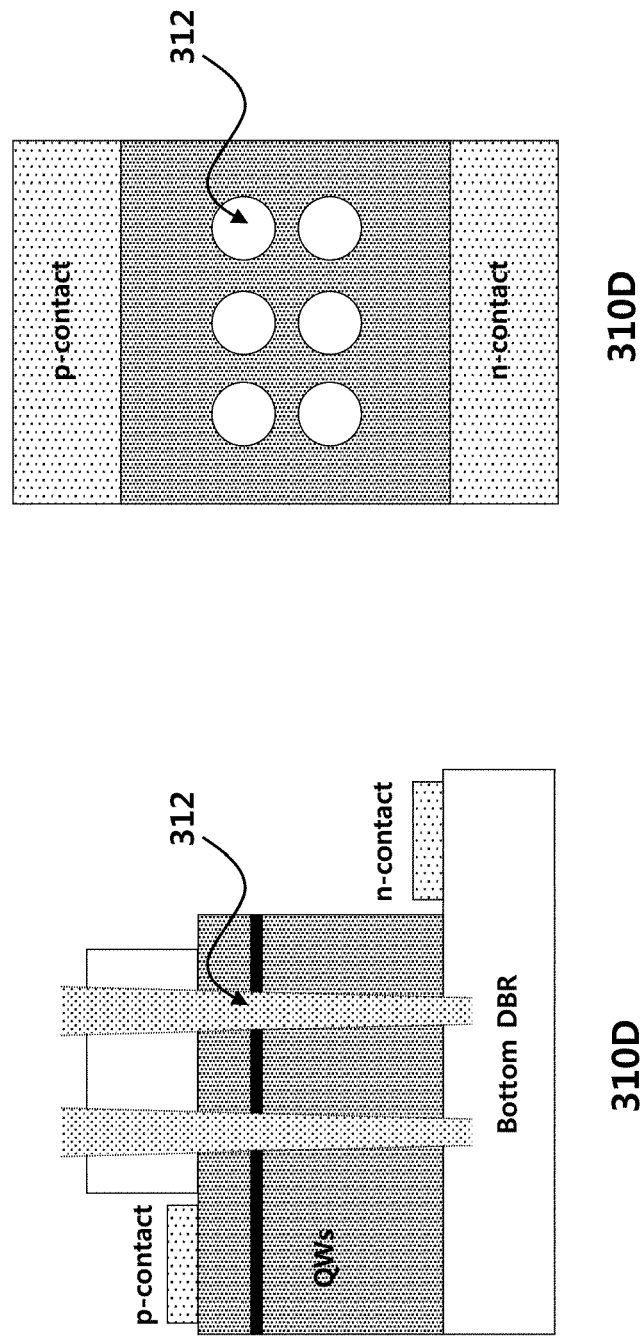

320

LIGHT SOURCE MODULE ALLOWING DIFFERENTIAL CONTROL ACCORDING TO DISTANCE TO SUBJECT AND METHOD FOR CONTROLLING THE SAME

BACKGROUND OF THE INVENTION

Field of the Invention

The present embodiment relates to a distance measurement device for measuring a distance by adjusting an output of a light source element of a light source part or by moving an optical device.

Description of the Prior Art

Methods for identifying three-dimensional information are epitomized by a stereo vision scheme, a structured-light scheme, and a time-of-flight scheme.

The time-of-flight (TOF) scheme, among the same, refers to a scheme in which a laser having a predetermined pulse is repeatedly produced, and the time of arrival of the pulse that returns after being reflected by an object is calculated, thereby measuring the distance. This scheme requires a projector for emitting a beam to the object, as in the case of the structured-light scheme. The TOF scheme is divided into a direct measurement scheme in which the time between when a pulse emitted from the transmission part is reflected by an object and when the pulse returns to the reception part is directly calculated, and an indirect measurement scheme in which the difference in phase between received pulses is calculated. The indirect measurement scheme is more widely utilized.

The structured-light scheme and the time-of-flight scheme, among the above-mentioned methods for identifying three-dimensional information, additionally perform a process of directing a beam emitted from the transmission part to an object, unlike the stereo vision scheme, and a light source is thus included. In addition, a beam needs to be emitted at a predetermined angle such that light from the light source reaches the object appropriately, and various optical devices are proposed to this end. Specifically, diffusers, prisms, or the like are widely used as optical devices. Various optical devices, including the same, may be used to appropriately adjust the beam angle.

A diffuser having a predetermined shape or a prism is commonly used as a conventional optical device, and the emission angle is determined according to the characteristics of surfaces formed at the time of manufacturing. This poses a problem in that detectable regions are limited because beams are transferred to objects according to the initially configured emission angle, regardless of the distance between the object and the light source, and the efficiency of transfer degrades in proportion to the distance from the center of a beam in the process of emitting the beam. Conventional optical devices also have a limitation in that, since a single optical device is used, angle adjustment for configuring various emission angles is impossible.

Meanwhile, a conventional distance measurement device commonly uses a laser as its light source, and cannot individually control the output with regard to respective regions of laser elements because laser elements for outputting light are simultaneously controlled. Particularly, the farther from the center of the light source, the less light reaches the object. This is regarded as a major factor that reduces power efficiency of the distance measurement device.

In addition, conventional distance measurement devices cannot individually control movements of optical devices, and thus fail to reach the output necessary for each distance, thereby wasting power. In addition, if light is emitted without dividing an object into regions, the intensify of light reaching each region decreases, thereby incurring the problems of noise and resolution degradation.

Moreover, conventional distance measurement devices have a problem in that, since a single light source element is used, the light source for long distance measurement has insufficient output. The light output may be increased if the output is concentrated in a specific region, but the measurable regions are inevitably reduced. If a single light source element is used to measure distance, the amount of emitted light is also reduced. As a result, it is impossible to obtain an appropriate amount of light reaching image sensors.

SUMMARY OF THE INVENTION

In this background, it is an aspect of the present disclosure to provide a light source module including one or more light source elements. It is another aspect of the present disclosure to provide a light source module including an optical device configured to move such that a sufficient amount of light is transferred to an object. It is another aspect of the present disclosure to provide an accurate distance measuring method, according to the distance of an object, by providing a method for driving a light source module.

To this end, a first embodiment may provide a light source module including: a light source part including at least one vertical cavity surface-emitting laser, which is configured to transfer light through N (N being a natural number equal to or greater than 1) apertures (or emitters); at least one collimator lens through which light emitted by the light source part passes; and a driving device configured to make the collimator lens move, wherein the at least one vertical cavity surface-emitting laser comprises divided regions, and an intensity of a beam is controlled according to a predetermined far-distance mode or near-distance mode.

There may be provided a light source module wherein the light transferred through the N apertures does not pass through any optical device configured to process a form of a beam, other than the collimator lens.

There may be provided a light source module wherein light reaching a subject in the light source module is divided into M (M being a natural number equal to or greater than 1) regions, and the M regions are linked with each other according to information about a field of view (FOV) of a reception part lens.

There may be provided a light source module wherein the driving device in the light source module is configured to adjust an alignment position of the vertical cavity surface-emitting laser so as to adjust a direction of a beam incident into the collimator lens.

There may be provided a light source module wherein the driving device in the light source module is configured to: control a current through an electromagnetic coil or a piezoelectric element; and to make the collimator lens move according to an intensity or direction of the current, thereby enabling relative position control between the light source and the optical element including the collimator lens.

There may be provided a light source module wherein the driving device in the light source module causes a movement in a direction perpendicular to or parallel to a light path in a far-distance mode, thereby adjusting the direction in which light is incident onto an optical element through an aperture (or emitter) of the light source, and a vertical working distance. In addition, the driving device causes a movement in a direction perpendicular to or parallel to the light path in a near-distance mode, thereby adjusting the direction in which light is incident onto the optical element through the aperture of the light source, and the vertical working distance.

There may be provided a light source module wherein two or more vertical cavity surface-emitting lasers operate in the near-distance/far-distance mode, and the working distance between the two or more vertical cavity surface-emitting lasers and the collimator lens is constant.

A second embodiment may provide a light source module including: a light source element including N (N being a natural number equal to or greater than 1) apertures (or emitters); a collimator lens (or DOE splitter) configured to make light, emitted by the light source element, pass and transfer a dot light source to a subject; and a control device configured to control a direction and a movement distance of the collimator lens according to a distance to the subject, wherein the control device includes a coil, a piezoelectric element, or a rotating device in order to control a current or a voltage.

There may be provided a light source module wherein the control device makes the collimator lens move in an X-axis, Y-axis, or Z-axis direction in a first mode to transfer an optimized high-density dot light source to the subject, and makes the collimator lens move in a Z-axis direction in a second mode to transfer a low-density homogeneous light source having characteristics different from those of the high-density dot light source to the subject. The order of the first mode and the second mode may vary depending on the operation order required by the system.

There may be provided a light source module wherein the light source module further includes a photodetector for measuring the intensity of light passing through a lens. The photodetector may determine whether or not the light source element operates normally according to the measured intensity of light.

There may be provided a light source module wherein the light source module includes pogo pin tensions connected to a substrate and configured to adjust a tension of an internal spring according to an intensity of a current, and a beam transmission direction is adjusted by the movement of the pogo pin tensions.

As described above, the present embodiment is advantageous in that electric power can be used efficiently by means of the light source module, and accurate distance calculation is possible.

BRIEF DESCRIPTION OF THE DRAWINGS

The above and other aspects, features and advantages of the present disclosure will be more apparent from the following detailed description taken in conjunction with the accompanying drawings, in which:

FIG. 7 illustrates a cross-section of vertical cavity surface-emitting laser (VCSEL);

DETAILED DESCRIPTION OF THE EXEMPLARY EMBODIMENTS

Figure 1:
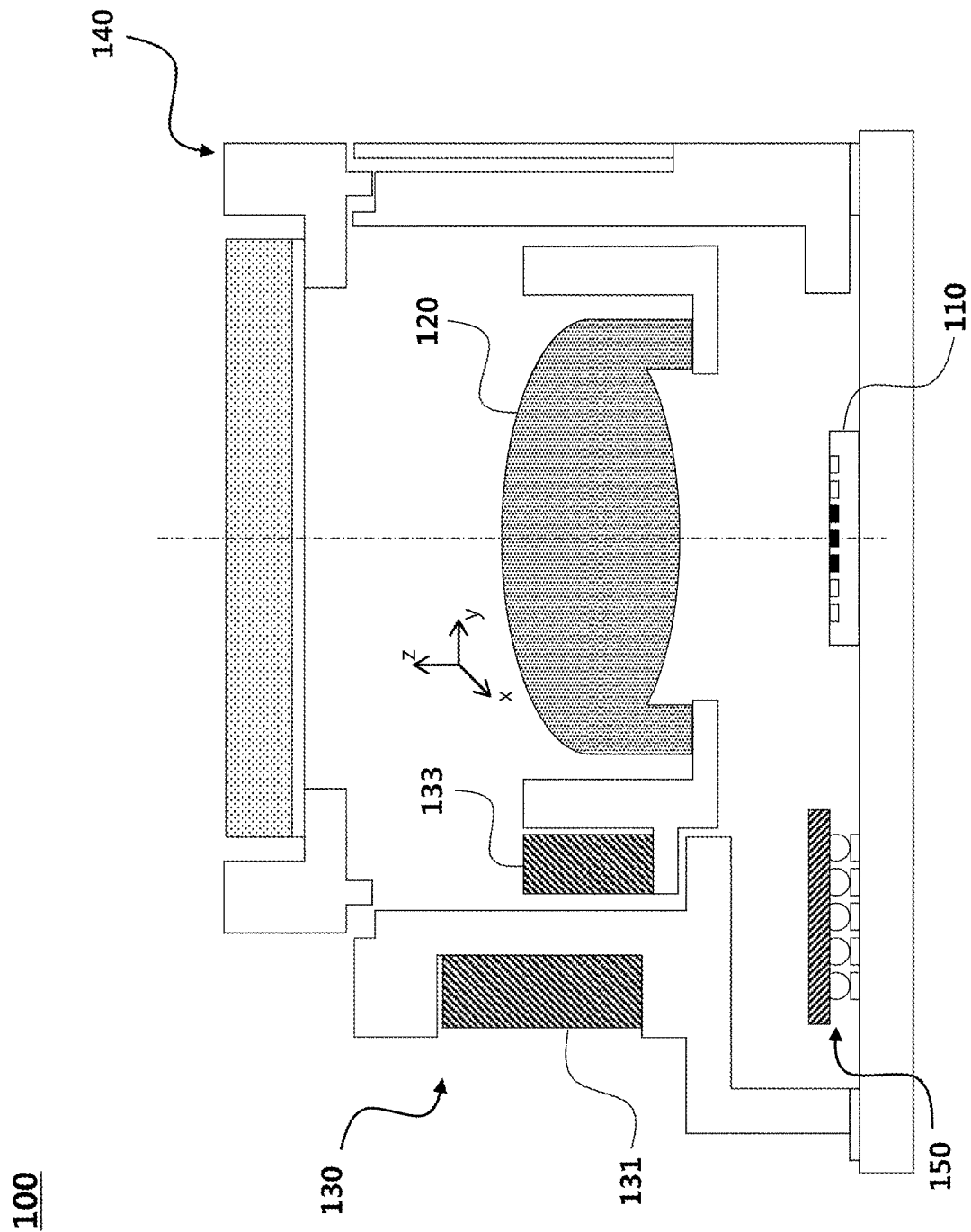
FIG. 1 is a first illustration showing an optical module according to one embodiment.

Hereinafter, some embodiments of the present disclosure will be described in detail with reference to the accompanying drawings. In adding reference numerals to elements in each drawing, the same elements will be designated by the same reference numerals, if possible, although they are shown in different drawings. Further, in the following description of the present disclosure, a detailed description of known functions and configurations incorporated herein will be omitted when it is determined that the description may make the subject matter of the present disclosure rather unclear.

In addition, terms, such as first, second, a, b or the like may be used herein when describing elements of the present embodiment. These terms are merely used to distinguish one element from other elements, and a property, an order, a sequence and the like of a corresponding element are not limited by the terms. It should be noted that if it is described in the specification that one element is "connected," "coupled" or "joined" to another element, a third element may be "connected," "coupled," and "joined" between the first and second elements, although the first elements may be directly connected, coupled or joined to the second element.

A "ray", "light", or a "beam" among elements of the present disclosure may be construed as having the same meaning without departing from the spirit of the present disclosure.

Further, a "light source", a "light source element", or a "light source part" among elements of the present disclosure may be construed as having the same meaning without departing from the spirit of the present disclosure.

Further, a "optical device", a "light diffusion device", or a "diffusion part" among elements of the present disclosure may be construed as having the same meaning without departing from the spirit of the present disclosure.

A conventional light source module includes one light source, wherein light, having passed through an optical device fixed to a frame, reaches an object, and thus the amount of light reaching the object is insufficient according to the distance of the object. As a result, accurate distance measurement is impossible and a radiation angle may not be controlled.

The present embodiment provides a light source module including at least one light source element; and an optical device movable to transfer a sufficient amount of light to an object, whereby more accurate optical data can be acquired. Further, the present embodiment provides an operation method of a light source module, thereby provide accurate distance measure method according to a distance from an object.

1. Light Source Module
2. Light Source Module—Basic Model

Referring to FIG. 1, a light source module 100 according to one embodiment may include at least one light source 110, at least one optical device 120, an actuator 130, a frame 140, and a control device 150.

Light transferred from the light source 110 of the light source module 100 may reach a target via the light diffusion device 120, and light reflected by a subject may reach an image sensor (not shown) of a reception part, whereby the distance between the light source and the subject may be measured. The distance of an object may be defined as half of a movement distance of light from the light source 110 to the image sensor (not shown), but is not limited thereto.

The distance of the object may be measured via the light source module 100, but three-dimensional data may be generated by combining acquired distance data with a two-dimensional image. If necessary, the light source module 100 may be defined as an element corresponding to all or a part of a 3D camera. Further, the light source module 100 may be defined as including both a transmitting module and a receiving module as necessary.

The arrangement and shapes of the elements of the light source module 100 may be variously defined as necessary, and the shapes and positions of the frame 140 and the control device 150 may be differently designed for more efficient light transfer.

The control device 150 may control the light source 110, the actuator 130, and the image sensor (now shown) through a control signal. The control device 150 may control the voltage or current of the light source module, and may process and calculate data of a transmission part and a reception part so as to provide a control signal to each element of the light source module.

1. Light Source Module—Modified Model

Figure 2:
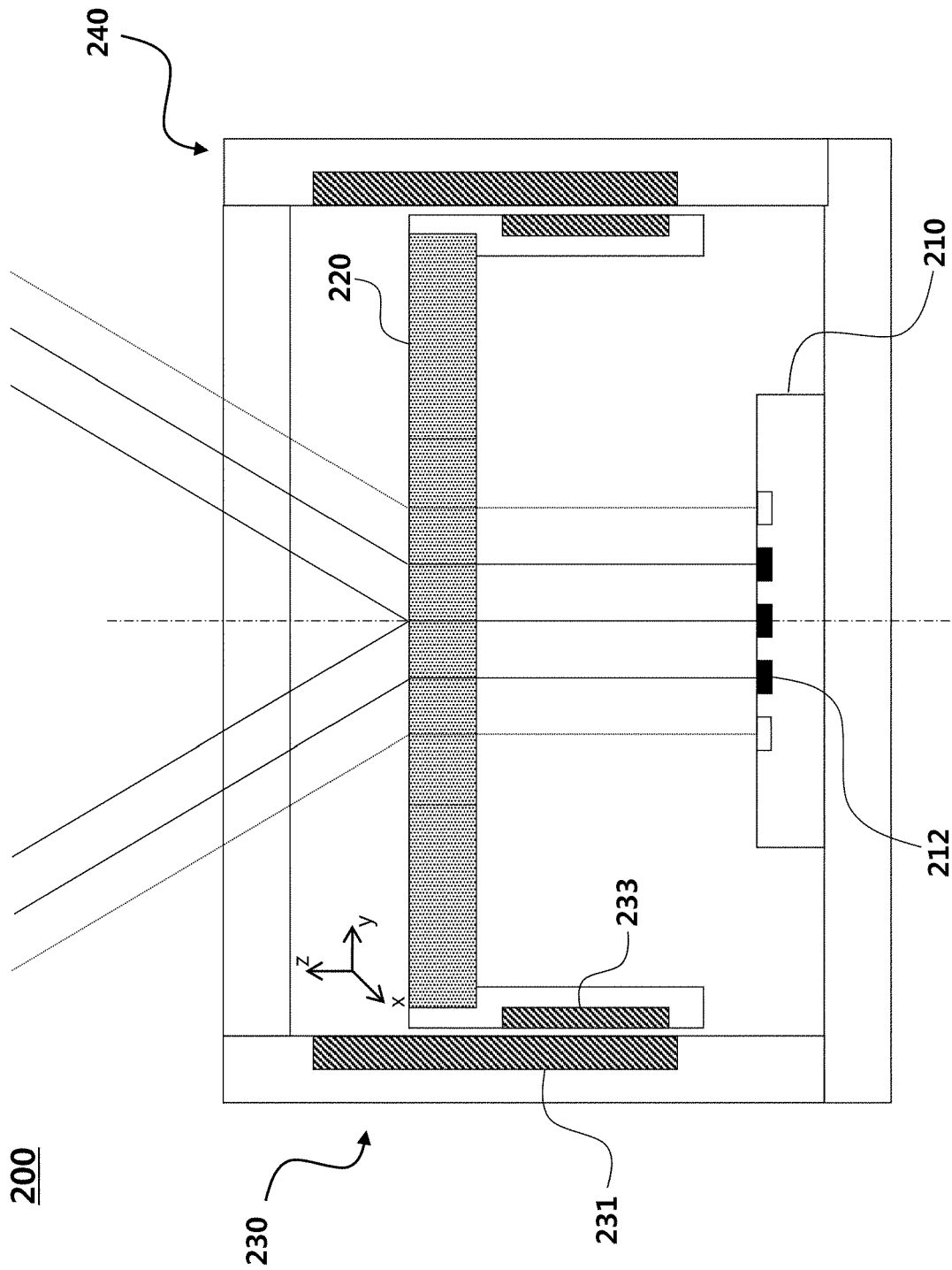
FIG. 2 is a second illustration showing an optical module according to one embodiment.
Figure 3:
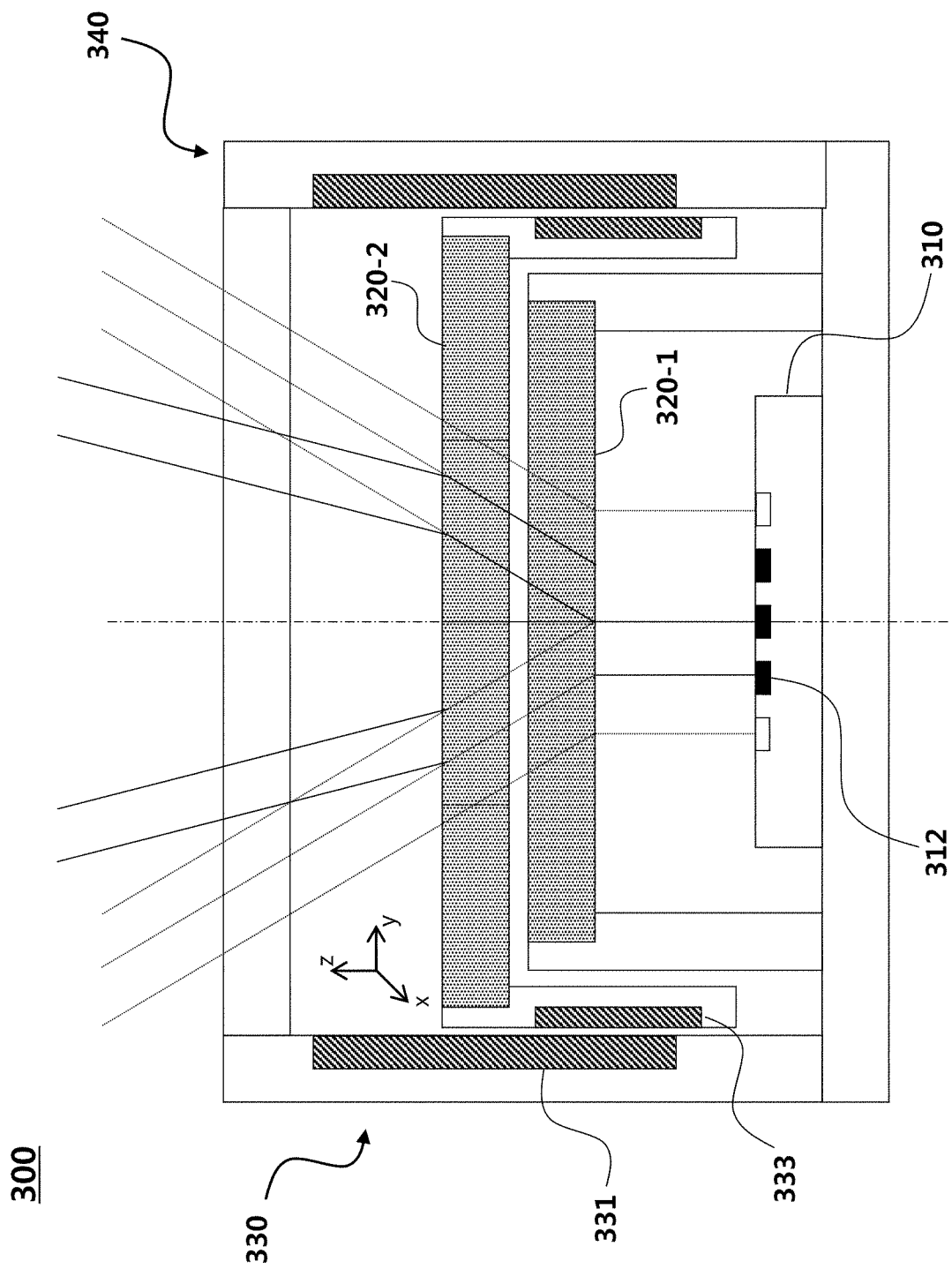
FIG. 3 is a third illustration showing an optical module according to one embodiment.
Figure 17:
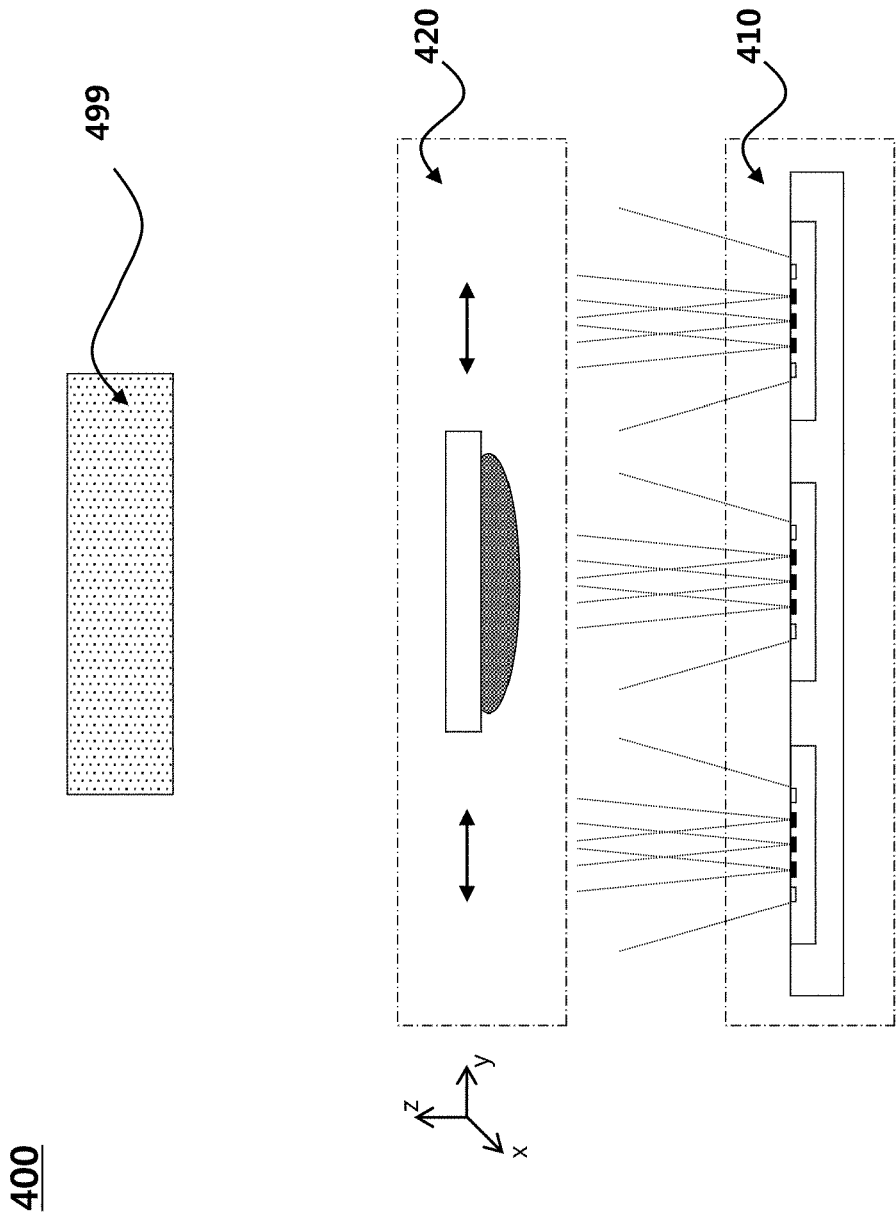
FIG. 17 is a first illustration showing a light source module including a plurality of light source elements according to one embodiment.
Figure 18:
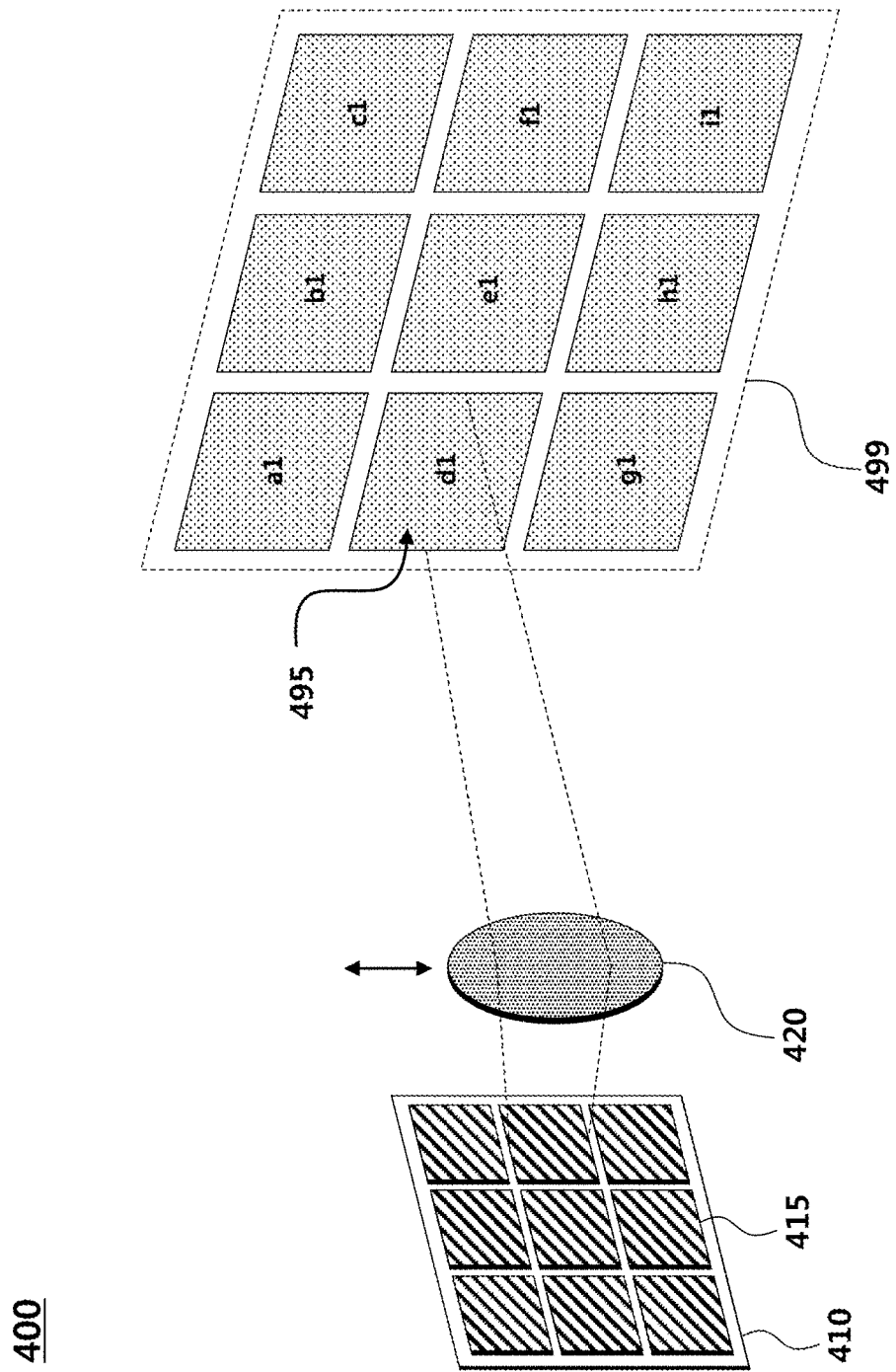
FIG. 18 is a second illustration showing a light source module including a plurality of light source elements according to one embodiment.
Figure 21:
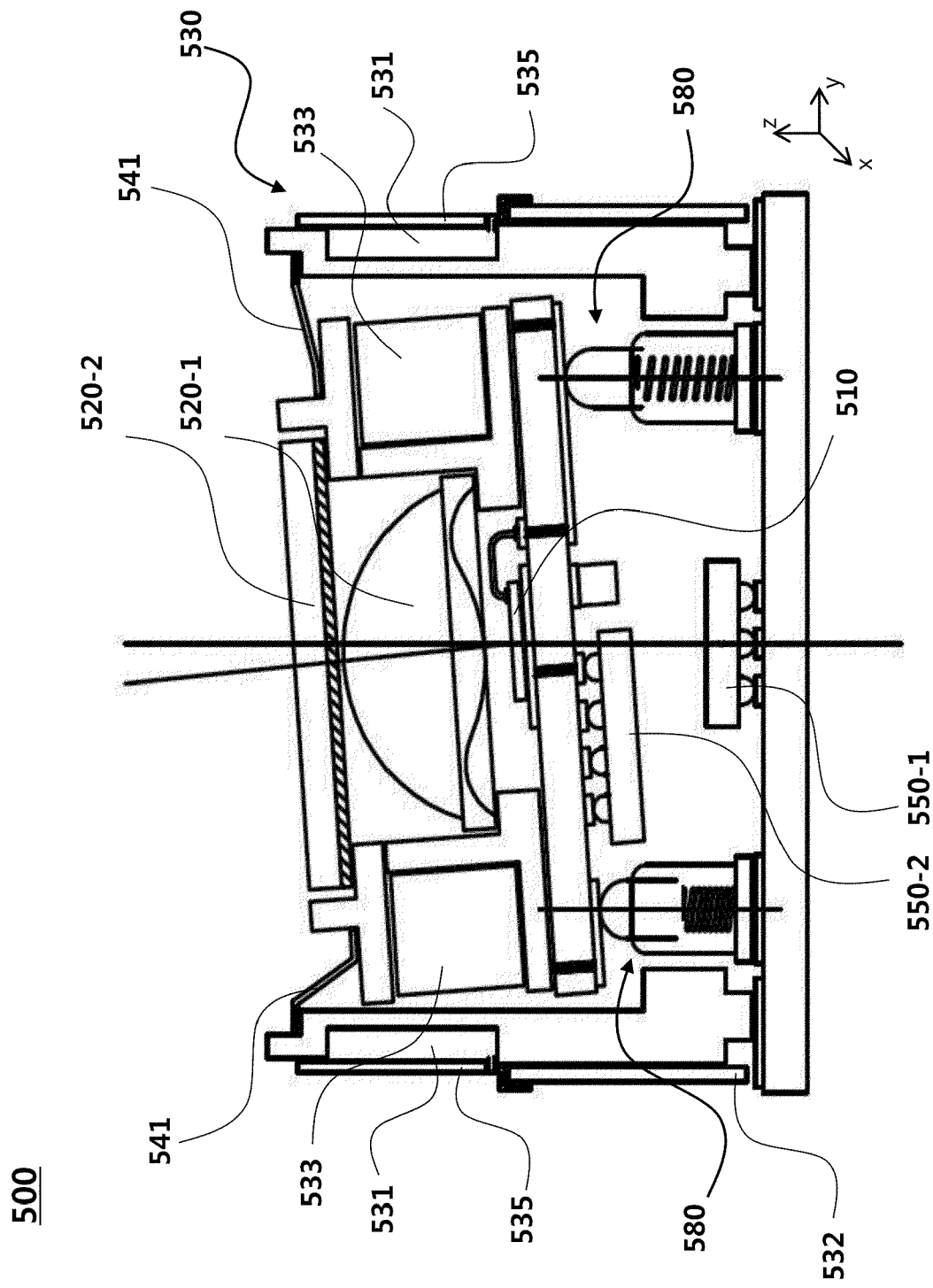
FIG. 21 illustrates a light source module capable of beam steering according to one embodiment.

A light source module may be variously defined, and, if necessary, may be shown as a drawing of a shape in which some elements are omitted. Referring to FIG. 2, according to one embodiment, a light source module 200 may include a single optical device 220. Referring to FIG. 3, according to another embodiment, a light source module 300 may include a plurality of optical devices, for example, a first optical device 320-1 and a second optical device 320-2. Referring to FIG. 17, according to another embodiment, a light source module 400 may include a plurality of light sources 410. Referring to FIG. 21, a light source module 500 may include a pogo pin tension 580, and thus may adjust a beam-emitting direction or may generate beam steering. According to another embodiment, a light source module may include a photodetector.

Transmitting (Tx) Module 2.1 Light Source

[Structure of Light Source]

A light source is a device for generating light and transmitting the light to an object, and may include various elements such as a vertical cavity surface-emitting laser (VCSEL), a light-emitting diode (LED), and the like. For convenience, a description may be made using, for example, the vertical cavity surface-emitting laser, but is not limited thereto. The light source may include a plurality of light source elements as necessary, and may receive control signals of a control device so as to individually adjust, based on the control signals, an output of each element or an output of regions in a single element.

The light source elements may be arranged like the light source 110 in FIG. 1, the light source 210 in FIG. 2, the light source 310 in FIG. 3, the light source 410 in FIG. 17, the light source 510 in FIG. 21, etc., but the arrangement thereof is not limited thereto.

[Structure of Vertical Cavity Surface-Emitting Laser (VCSEL)]

Referring to FIG. 7, a light source 310 according to one embodiment may include a body part 311, apertures 312, and a lens (not shown). For example, the light source 310 may be a vertical cavity surface-emitting laser (VCSEL), and FIG. 7 briefly illustrates the vertical cavity surface-emitting laser with an omitted part of the actual structure thereof to the extent required to describe the present disclosure.

The vertical cavity surface-emitting laser (VCSEL) may include a plurality of apertures. An aperture is a hole formed in a light source element through a predetermined process, and may be defined as a hole from which light, having optical density increased through a resonance process and finally emitted, is emerged.

According to one embodiment, light coming out from an aperture may form a predetermined region. For example, the radiation angle of light coming out from an aperture of a light source element may be about 20 degrees, but may be differently defined depending on design conditions of a product.

The body part may be defined as being the remaining element of the light source element excluding the aperture, and the shape and type of the body part are not limited.

The field of view (FOV) of light first generated by the vertical cavity surface-emitting laser (VCSEL) may be limited, and may be primarily adjusted by the inner diameter and design value of the aperture 312 in the vertical cavity surface-emitting laser (VCSEL). The lens may be a small lens, and may have functions of diffusing and refracting light emitted by the light source element.

[Individual Control of Output of Each Region of Light Source]

A light source may include at least one light source element. A single light source element may be divided into a plurality of regions, and light output of each of the regions may be individually controlled.

Figure 6:
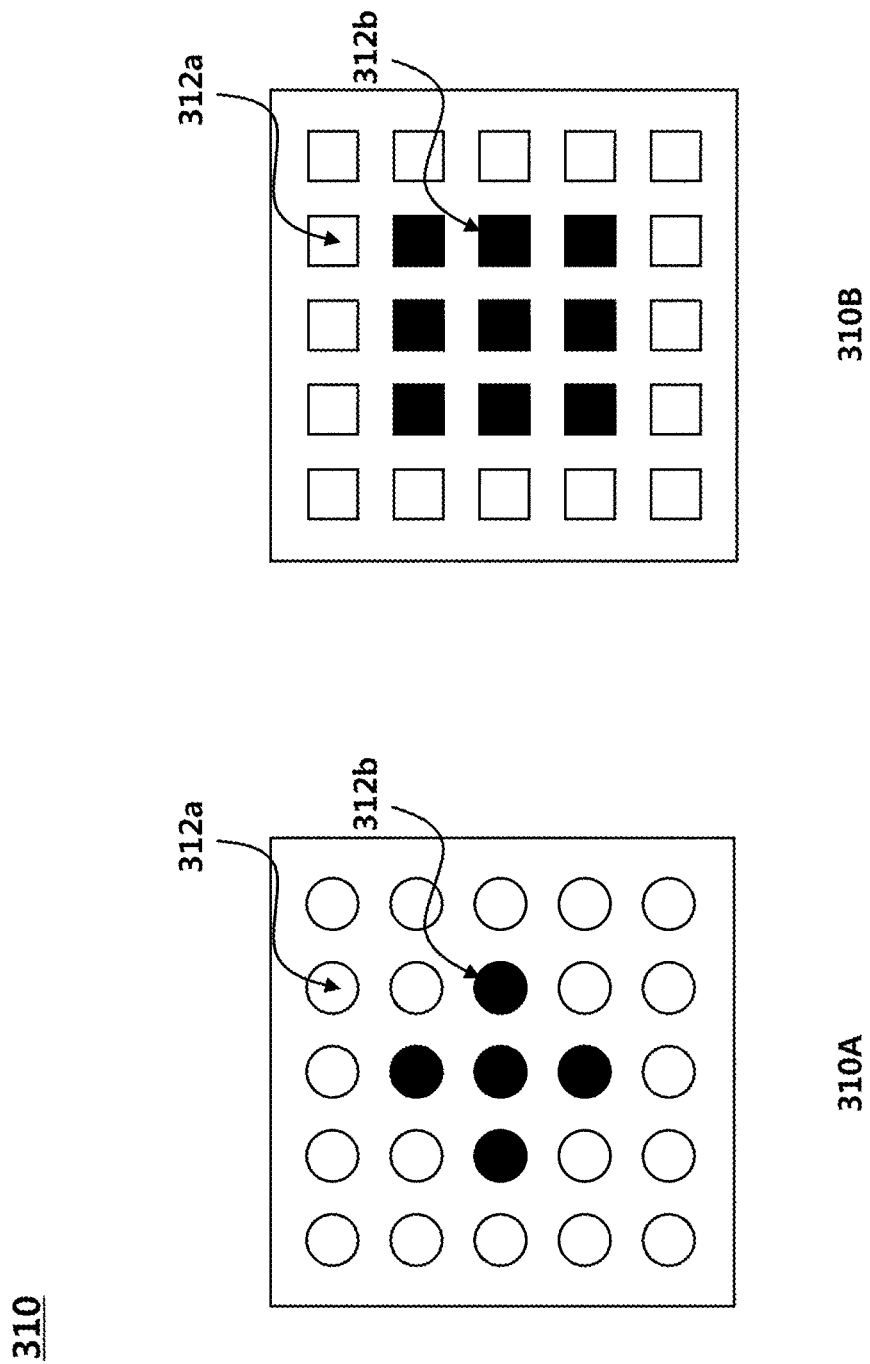
FIG. 6 illustrates separate regions of a light source element.

Referring to FIG. 6, as necessary, the region of the light source 310 may be configured and divided into a first region 312a and a second 312b, and the output of the first region and the output of the second region may be individually adjusted by a control device. Each region may be defined in a continuous form, but may be defined in a discontinuous form as necessary.

The output of the second region, among the configured regions of the light source, may be adjusted to be lower than the output of the first region. The intensity of output of each region may be appropriately distributed within the maximum output of the light source module, thereby facilitating optimal power consumption. The intensities of outputs of the regions may be appropriately distributed within the maximum output range, and thus optimal power use may be achieved.

The output of the light source may be sequentially controlled for each region, and the control sequence may be differently defined as necessary. Outputs of a plurality of regions of the light source may be individually controlled by a control device (not shown), and the modes of the plurality of regions may be sequentially switched to ON/OFF modes.

According to one embodiment, efficient power use may be achieved by individually controlling each light source element.

According to one embodiment, when a light output device 100 operates in far-distance mode or in near-distance mode, light output in far-distance mode needs to be configured to be high, and light output in near-distance mode needs to be controlled to be lower than that in far-distance mode. A light source element of a light source may be divided into a plurality of regions, and efficient power use may be achieved by individually controlling only some regions, among the plurality of regions, according to a predetermined reference.

For example, in far-distance mode, control may be performed such that elements of all regions of a light source are used to generate the maximum output. If necessary, even in far-distance mode, there may be a need to adjust the intensity of output according to the position of a subject.

In another example, in near-distance mode, control may be performed such that elements of some regions of a light source are used to generate the minimum output. If necessary, even in near-distance mode, there may be a need adjust the intensity of output according to the position of a subject.

The method of dividing the region of a light source and individually controlling current of individual elements or apertures enables more efficient and accurate distance measurement than a method of simultaneously controlling all elements or apertures.

For example, the vertical cavity surface-emitting laser (VCSEL) may include 25 apertures arranged in 5×5 array, and thus may allow more efficient and accurate distance measurement than the case of controlling output of each element for a corresponding opening.

Outputs of elements in separate regions of the light source may be individually controlled, the state in which the value of current of a light source element is zero may be defined as a turned-off state (OFF), and the state in which the value of current of the light source element is not zero may be defined as a turned-on state (ON).

Referring to FIG. 6, according to one embodiment, in near-distance mode, the light source part aperture 312a may be in a turned-off state (OFF), and only the light source part aperture 312b may be in a turned-on state (ON). A power consumption amount may be reduced by controlling the number of light source elements from which light is output.

According to another embodiment, in near-distance mode, the output intensity of an individual element, which is in a turned-on state (ON), may be precisely controlled. The intensity of output of the light source part apertures 312 may be precisely adjusted, based on a predetermined reference, according to the distance of each of a subject present at a first distance and a subject present at a second distance. For example, when a first distance is longer than a second distance, the intensity of light at the first distance may be controlled to be stronger than the intensity of light output at the second distance.

According to one embodiment, in far-distance mode, all of the light source part apertures 312 may be in a turned-on state (ON). Acquiring distance information of a remote subject normally requires a larger amount of light.

According to another embodiment, in far-distance mode, the output intensity of an individual element, which is in a turned-on state (ON), may be precisely controlled. The intensity of output of the light source part apertures 312 may be precisely adjusted, based on a predetermined reference, according to the distance of each of a subject present at a third distance and a subject present at a fourth distance. For example, when a third distance is longer than a fourth distance, the intensity of light at the third distance may be controlled to be stronger than the intensity of light output at the fourth distance.

In relation to a circuit design for controlling individual elements or a plurality of apertures 312 in the light source 310, a printed circuit board (PCB) may be designed according to a well-known technology, and a wire-bonding type or flip chip type design may also be included.

[Individual Control of Outputs of a Plurality of Light Source Element]

Referring to FIGS. 17 to 20, according to one embodiment, the light source 410 of the light source module 400 may include a plurality of light source elements. When a plurality of light source elements are used, more increased amount of light may be transferred to a subject. Compared with a single light source element, individual light source elements may be independent physical entities, and may be disposed with independent regions.

Figure 19:
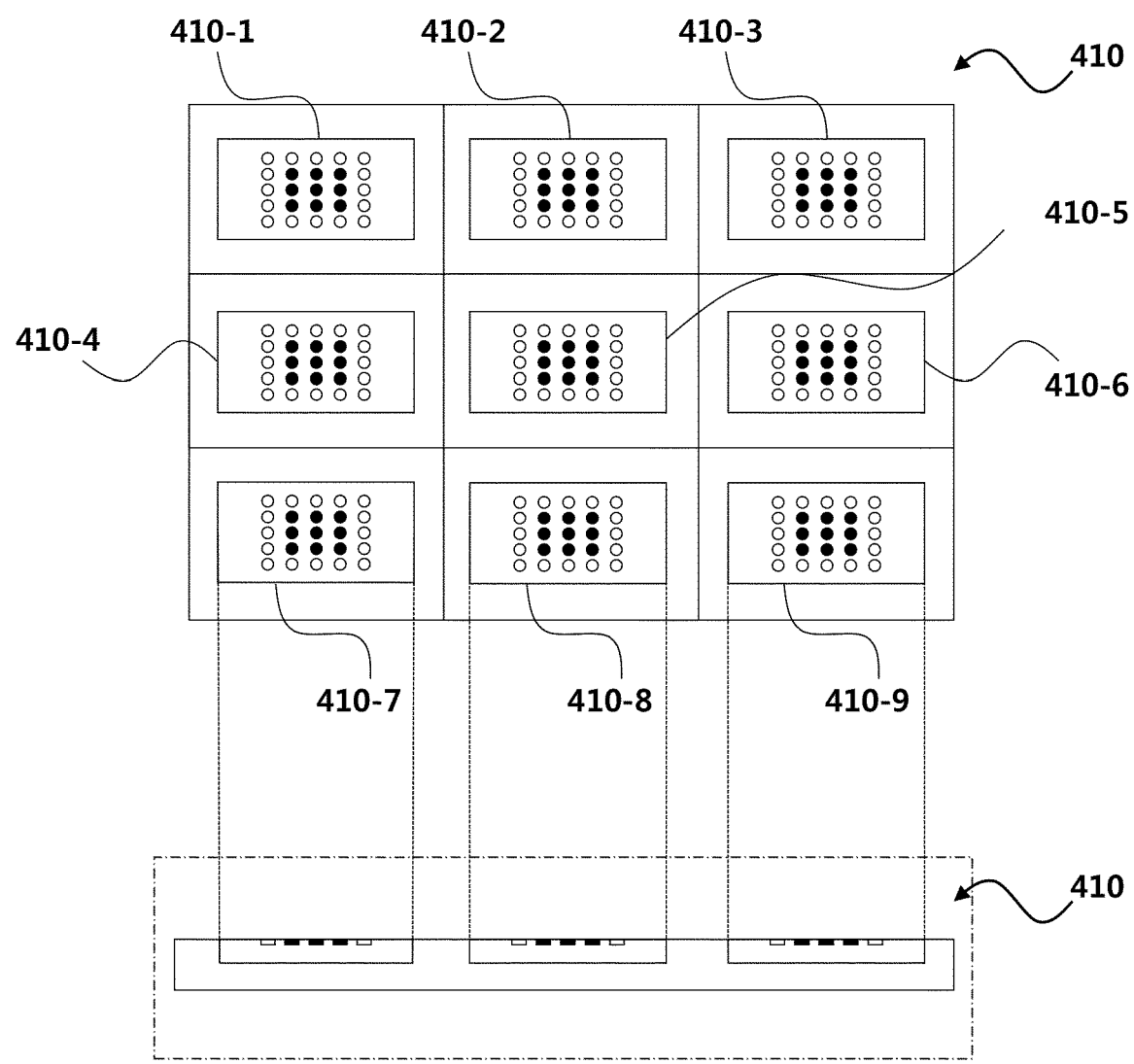
FIG. 19 is a third illustration showing a light source module including a plurality of light source elements according to one embodiment.

For example, in the case of the light source 410 in FIG. 19, a first light source element 410-1 to a ninth light source element 410-9 may be defined and arranged.

When a single light source element is used, the resolution recognized by an image sensor of a reception part is limited. Further, the amount of power usable by the single light source element is limited, and thus the amount of light reaching an object is also limited.

Therefore, the light source module 400 using a plurality of light source elements according to one embodiment may acquire a high resolution. Further, when a plurality of light source elements are used, a sufficient amount of light may be transferred to an object or the reception part, and thus, the above-described problem of an insufficient amount of light may be solved.

Light transferred from the independent regions of the light source 410 may passes through an optical device, and may have individual fields of view. The reason that light from the regions in the light source module have individual fields of view is that light is required to be uniformly and widely emitted to an object in order to accurately measure a distance and acquire a high-quality image. The intensity of light transferred from each of the light source elements may be adjusted according to current individually transferred to the light source element.

An actuator of the light source module 400 may move an optical device in response to outputs of the plurality of light source elements.

In the light source module 400, when all the light source elements included in the light source 410 are simultaneously operated, a sufficient amount of light may be transferred to an object, but the consumption of power may rapidly increase. Therefore, for optimal power consumption, outputs of some elements among the plurality of light source elements may be individually controlled, and more efficient distance measurement may be performed through the movement of the optical device.

According to one embodiment, similarly to a method for individually controlling current of apertures in a single light source element, more efficient distance measurement may be performed by controlling each of the plurality of light source elements.

The method for individually controlling apertures in a single light source element is different from the specific method for controlling each of a plurality of light source elements, but a principle of light output control for measuring a remote subject or a short-range subject may be identically applied.

Since there are a plurality of light source element, the movement distance of the optical device may be reduced compared with the case in which there is a single light source element, and thus an operation time may be reduced.

Figure 20:
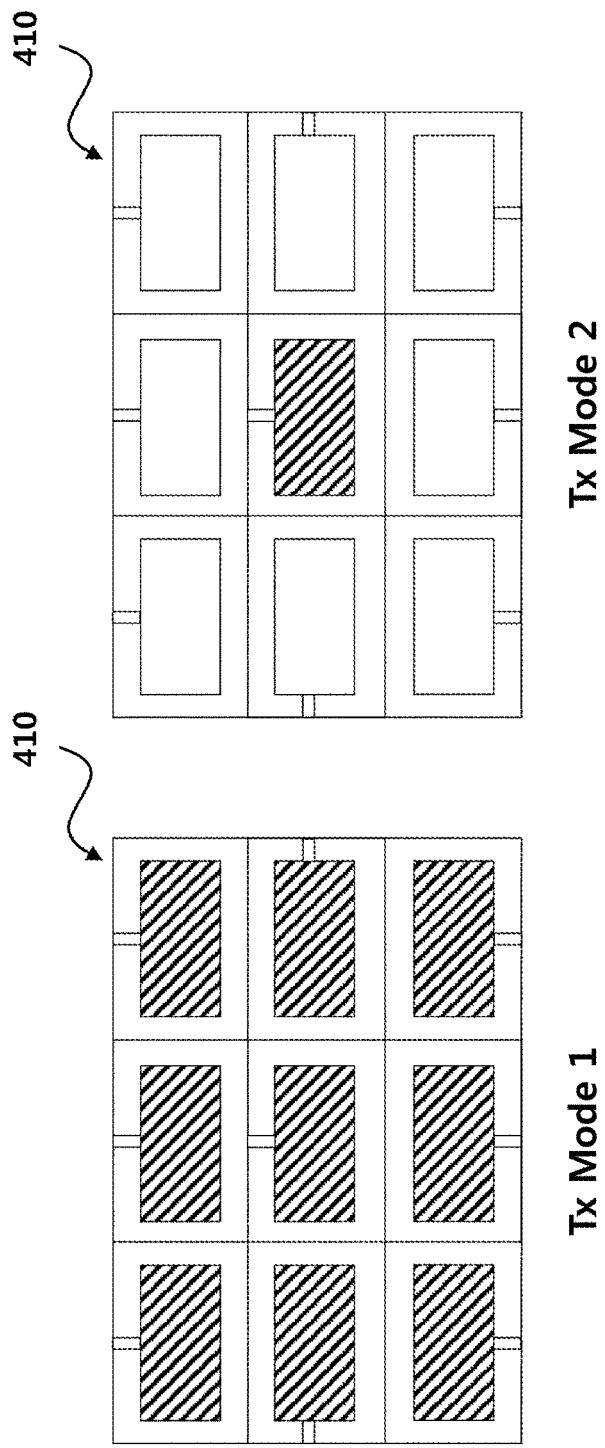
FIG. 20 is a fourth illustration showing a light source module including a plurality of light source elements according to one embodiment.

Referring to FIG. 20, the influence of a plurality of light source elements of the light source 410 according to one embodiment on each other may be minimized using flip chip. Flip chip is a method for directly placing a semiconductor chip on a circuit board with an electrode pattern at the bottom of the chip, without using any intermediate connection medium such as a wire, when attaching the semiconductor chip to the circuit board. The flip chip may have advantages of: preventing the complex of wires in the case of connecting a plurality of light source elements; and preventing an intermediate connection medium from blocking light emitted by light source elements of a light source module.

For example, when a light source element is a vertical cavity surface-emitting laser, light may be emitted using a resonance between a negative electrode and a positive electrode. When a light source element is installed on a substrate by using a flip chip method, wiring may be performed without affecting another light source part.

Current supplied to each of a plurality of light source elements may be individually adjusted by individual circuit wires for the plurality of light source elements. For example, in order to measure a distance in short-range mode, there is a need to reduce power consumption, and thus a distance may be measured using only a light source element disposed at a center portion.

2.2 Optical Device

[Configuration of Optical Device]

An optical device according to one embodiment may diffuse or refract light, transferred from a light source, in various directions. Concaves and convexes formed on the surface of the optical device may have various shapes and may be made of various materials, and a light-diffusing angle may be variously set depending on such shapes and materials. Light emitted by a light source may be diffused or refracted at a targeted radiation angle through the optical device so as to be transferred to an object.

[Type of Optical Device]

An optical device according to one embodiment may be made of various optical material or may have various characteristics according to the physical configuration, operation function, and design condition of a light source module.

For example, a Fresnel lens may be processed as necessary and used as the optical device. Further, one selected from among at least a prism, a diffusor, a splitter, a diffractive optical element (DOE), and a collimator lens or a combination thereof may be used as the optical device.

An optical device according to one embodiment may be formed of a micro-lens array (MLA), and the surface of the optical device may be variously processed according to the characteristic or shape of a used material.

[A Plurality of Optical Devices]

Referring to FIGS. 1 and 2, each of the light source modules 100 and 200 according to one embodiment may include one or more optical devices. Referring to FIG. 3, the light source module 300 according to one embodiment may include two optical devices, and the optical devices may be defined as the first optical device 320-1 and the second optical device 320-2.

Light emitted from a light source passes through the first optical device 320-1 and may then be transmitted to the second optical device 320-2. In this case, the radiation angle of the light transferred from the light source may increase or decrease, according to the movement of an actuator 330, while passing through the first optical device.

The operation mode of the light source module may be defined according to the relative distance between the first optical device and the second optical device. For example, the operation mode of the light source module may be a far-distance mode or a near-distance mode, and the number and types of operation modes of the light source module may be variously defined according to necessity.

[Region of Optical Device]

Referring to FIGS. 8 to 14, the region of an optical device 320 according to one embodiment may be divided into one or more regions. The position, direction, and arrangement of each region may be defined differently as necessary. The surface of the optical device having a plurality of divided regions may be differently formed such that light is capable of being transferred to each region of an object.

Figure 8:
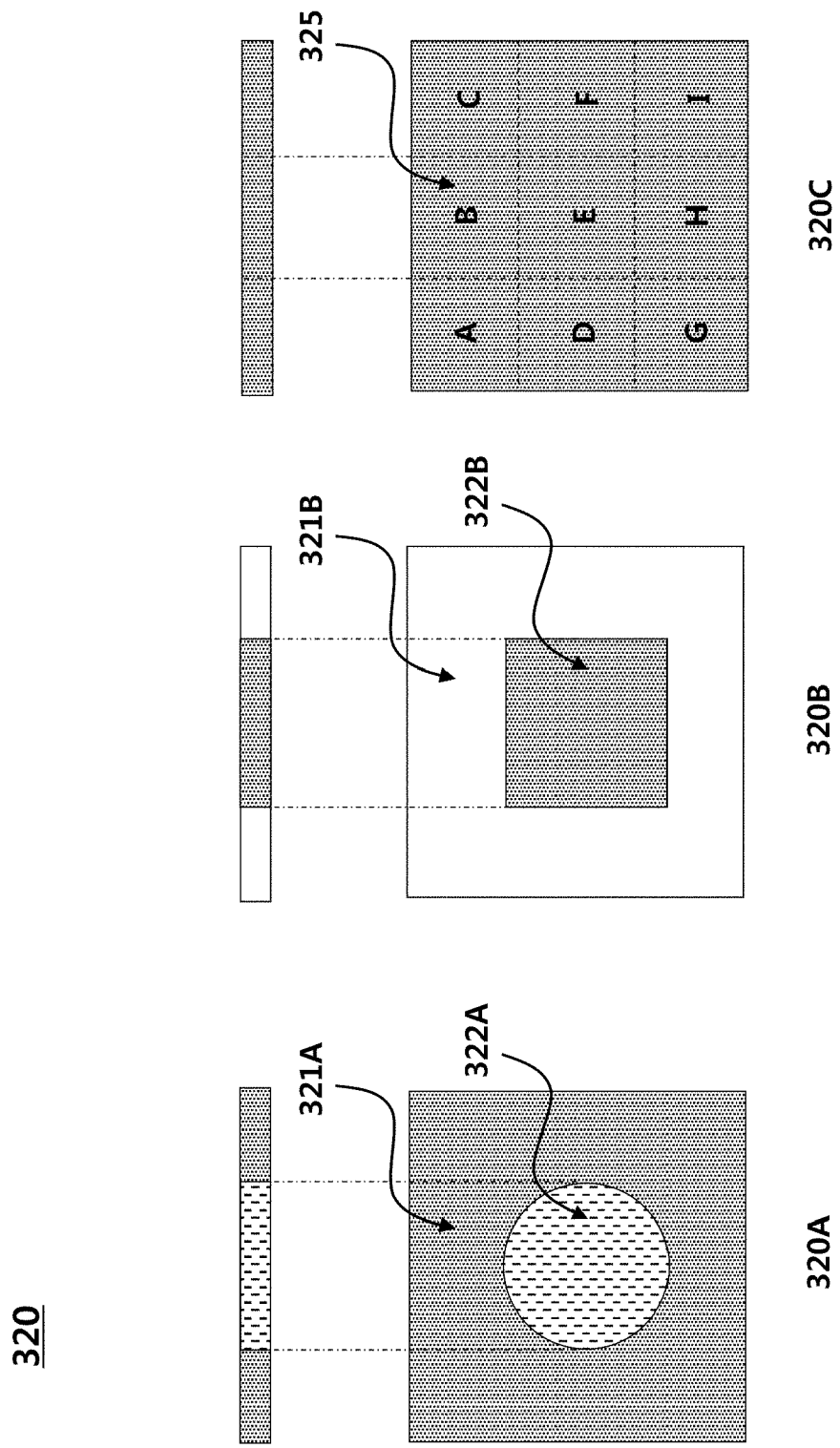
FIG. 8 illustrates separate regions of an optical device.

Referring to FIG. 8, a first region 321A and a second region 322A of an optical device 320A according to one embodiment may be defined as having different physical characteristics, and light passing through each region may have a different radiation angle. An optical device 320B according to another embodiment may be defined as having a first region 321B, which allows light to pass therethrough as it is, and a second region 322B, which diffuses light, wherein the first region may be open or may be formed of a material which diffuses light to a small degree. An optical device 320C according to another embodiment may be divided into a plurality of regions 325, and the regions may be defined as having different physical characteristics. The physical characteristic of each region may be defined according to a radiation angle, but may be defined as a characteristic such as a refractive index as necessary. For example, an optical device may be divided into nine regions.

Figure 4:
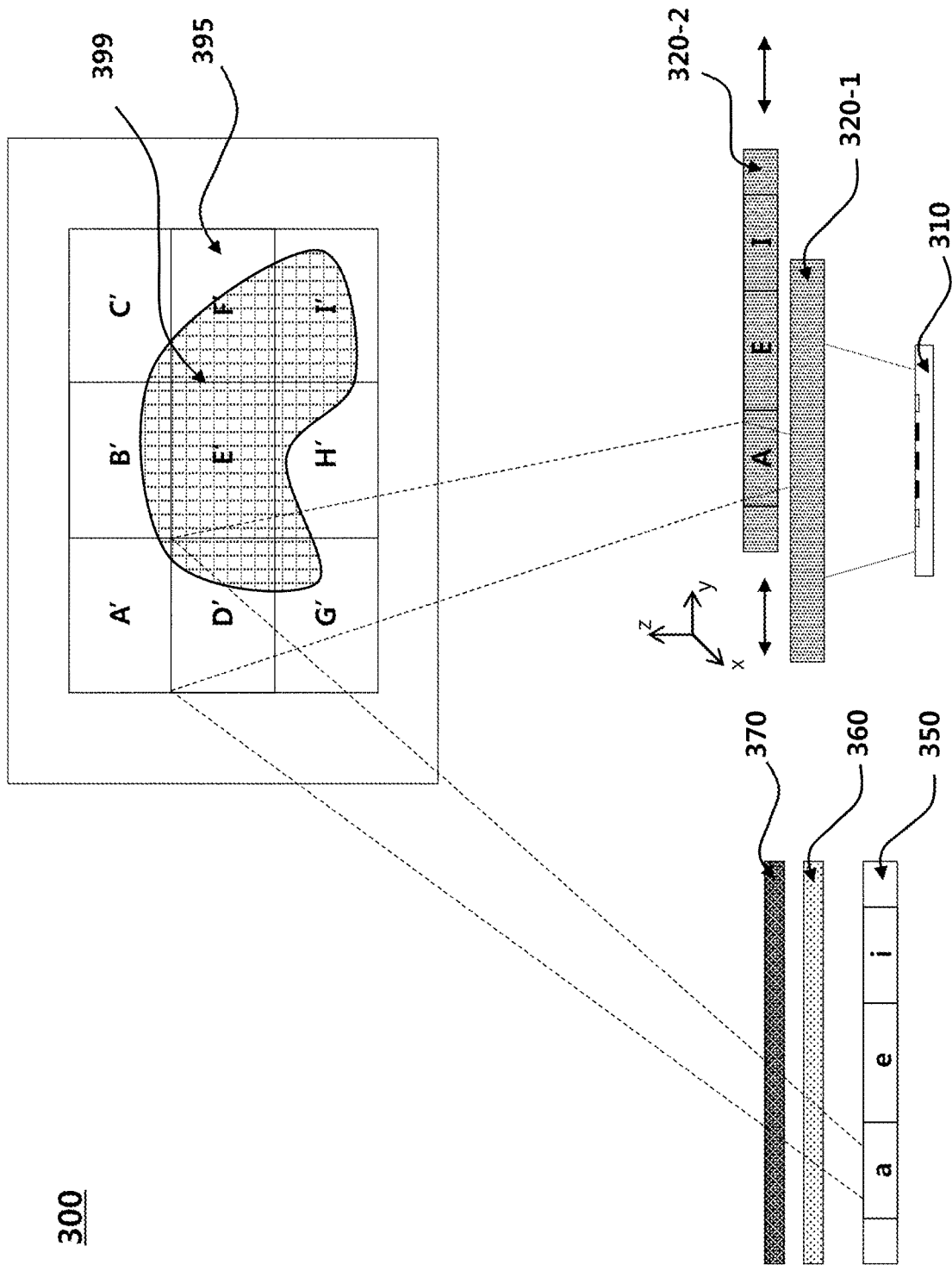
FIG. 4 illustrates an optical module including a reception part according to one embodiment.
Figure 5:
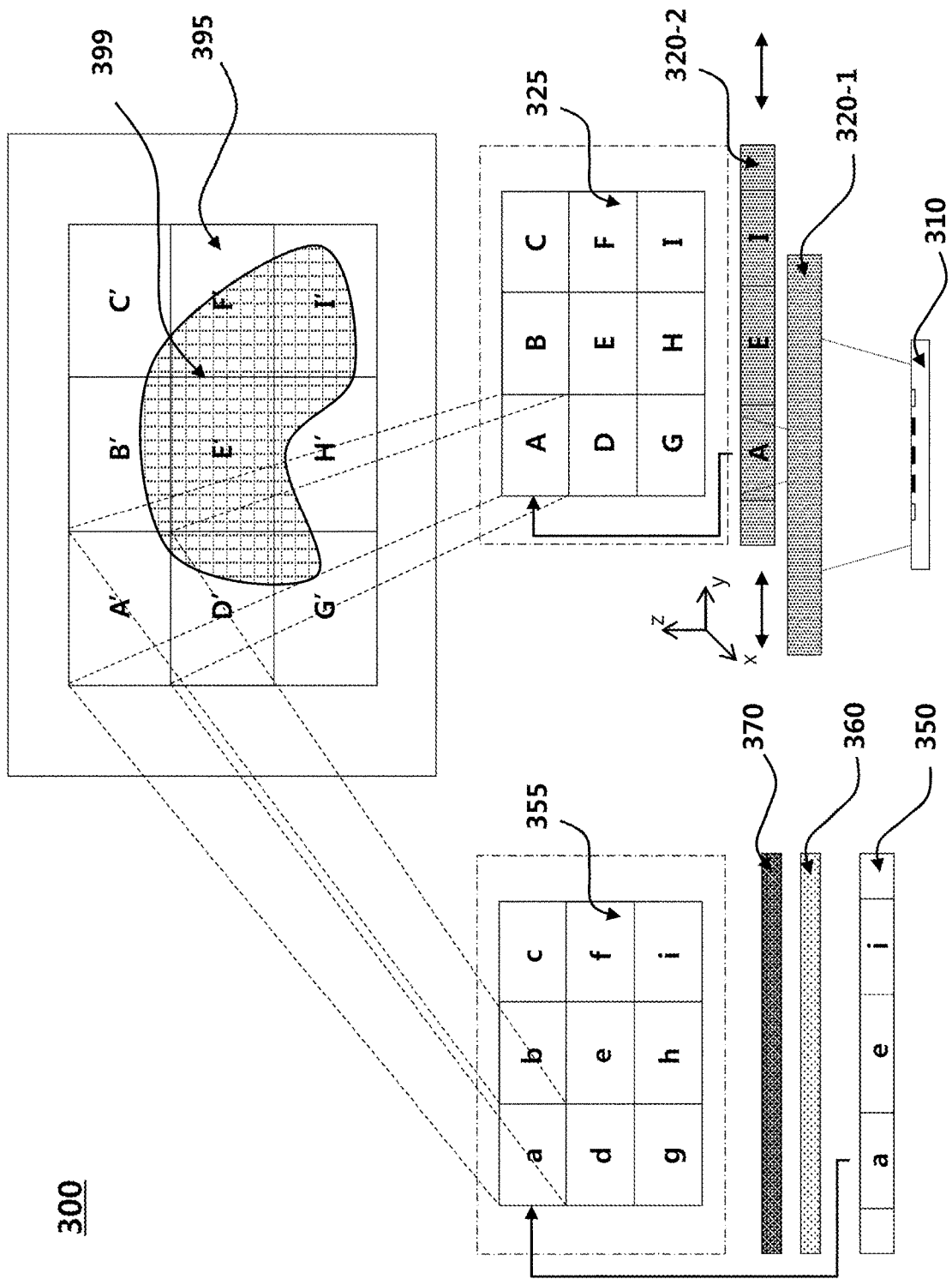
FIG. 5 illustrates separate regions of a light source module including a reception part according to one embodiment.

Referring to FIGS. 3 to 5, two optical devices according to one embodiment may be defined as the first optical device 320-1 and the second optical device 320-2. The operation mode of the light source module may be defined according to the relative distance between the first optical device and the second optical device. For example, the operation mode of the light source module may be a far-distance mode or a near-distance mode.

Referring to FIG. 8, one or more regions of the optical device may be defined according to the relative distance between two optical devices or a mode of the light source module. The surface of one region of the optical device may be manufactured to be different in shape and material from the surfaces of other regions in order to reduce a radiation angle in far-distance mode. For example, the second region 322A of the optical device 320A may be used in far-distance mode in which the relative distance between two optical devices is reduced.

If necessary, each region of an optical device may be formed of a single material, and may have a different pattern in order to adjust the radiation angle of the center and the outer periphery thereof according to a predetermined mode of a light source.

[Form of Optical Device]

Figure 9:
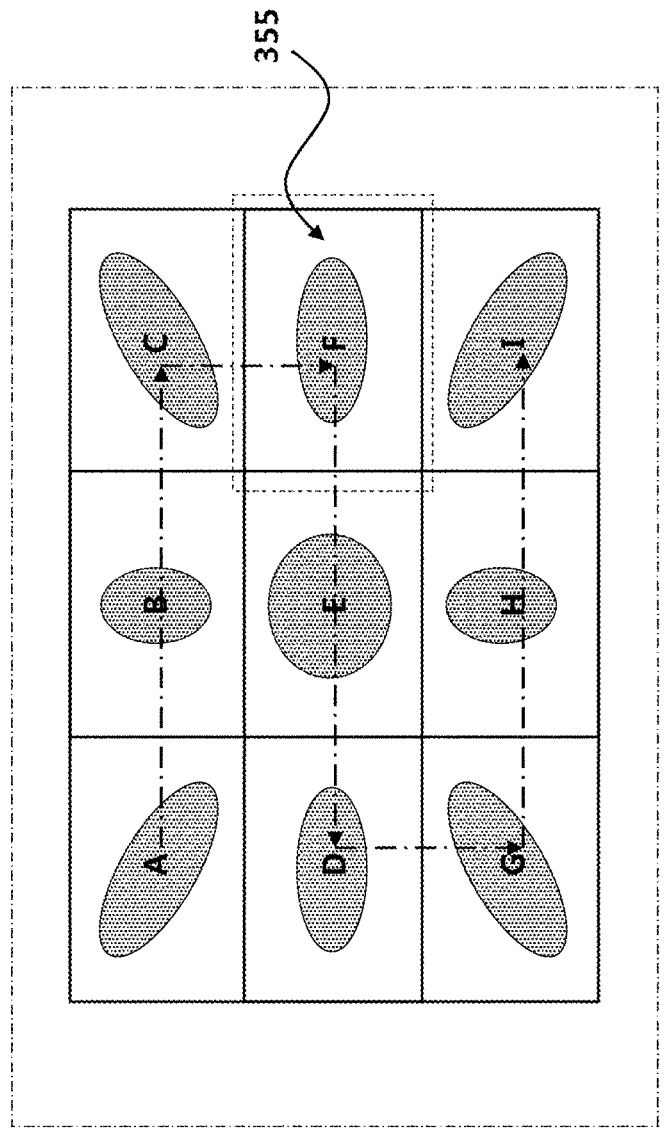
FIG. 9 is a first illustration showing region-specific movement of an optical device.

Referring to FIG. 9, the optical device 320 according to one embodiment may be manufactured as a micro-lens array (MLA). Fields of view of individual light beams of a plurality of light source elements may be different from each other, and, to this end, the micro-lens array may include micro-lenses which is formed to be asymmetrical. According to another embodiment, each of the one or more micro-lens arrays may include micro-lenses formed to be symmetrical or a group of lens. The micro-lens array positioned at the center of the optical device needs to be symmetrically formed. For example, only the center lens may be used without causing any movement of the optical device 320 (that is, in a fixed state) in a near-distance mode.

Further, the one or more micro-lens arrays may be formed to have different refractive indexes according to regions. In order for light to be transferred from an optical device to an object, the transfer direction of light needs to be adjusted using the actuator 330, and the transfer direction of light may be adjusted by allowing the micro-lens arrays to have different refractive indexes according to regions. Further, the one or more micro-lens arrays may be arrayed so as to transfer light in accordance with sequential movement of the optical device 320. According to one embodiment, all or only some of arranged light source elements may be used, and all or some of regions of a light diffusion device may be used according to the number of light source elements. For example, light may be sequentially transferred through the movement of the optical device.

Referring to FIG. 9, according to one embodiment, the region of the optical device 320 may be divided into nine individual regions 355. For example, a first region of the optical device may be formed to be asymmetrical in the left upper end direction, and a second region of the optical device may be formed to be asymmetrical in the vertical direction. A third region of the optical device may be formed to be asymmetrical in the right upper end direction, and a fourth region of the optical device may be formed to be asymmetrical in the horizontal direction. A fifth region of the optical device may be formed to be symmetrical in all directions. A sixth region of the optical device may be formed to be asymmetrical in the horizontal direction, and a seventh region of the optical device may be formed to be asymmetrical in the left lower end direction. An eighth region of the optical device may be formed to be asymmetrical in the vertical direction, and a ninth region of the optical device may be formed to be asymmetrical in the right lower end direction.

Figure 14:
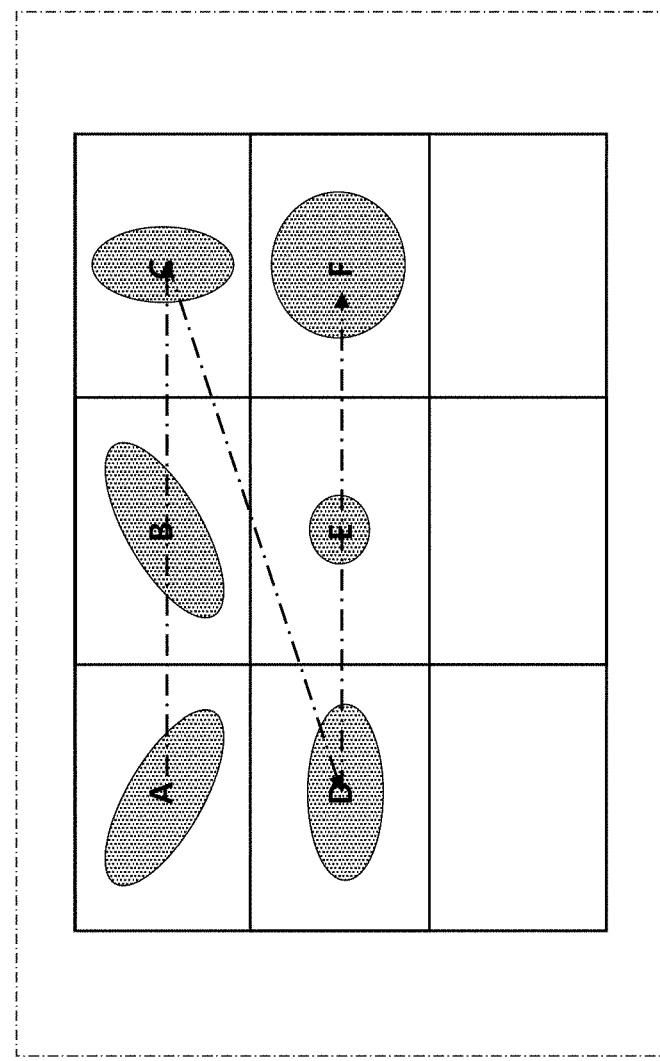
FIG. 14 is a sixth illustration showing region-specific movement of an optical device.

Referring to FIG. 14, according to another embodiment, a 10th region of the optical device may be asymmetrical in the left diagonal direction, and a 11th region of the optical device may be asymmetrical in the right diagonal direction. A $12^{th}$ region of the optical device may be asymmetrical in the horizontal direction, and a $13^{th}$ region of the optical device may be asymmetrical in the horizontal direction. A $14^{th}$ region and a $15^{th}$ region of the optical device may be symmetrical in all directions, and may be different in size from each other.

For example, the first to ninth regions of the optical device 320 in FIG. 9 may be used to measure a distance in far-distance mode. For example, the $10^{th}$ to $14^{th}$ regions of the optical device 320 in FIG. 14 may be used to measure a distance in far-distance mode. For example, the $15^{th}$ region of the optical device 320 in FIG. 14 may be used to measure a distance in near-distance mode 2.3 Actuator

[Configuration of Actuator]

Referring to FIGS. 1, 2, 3, 4, and 21, various types of devices, which are capable of spatially moving an optical device, may be used as an actuator according to one embodiment. The actuator may adjust the light transfer direction or radiation angle of an optical device.

Referring to FIG. 1, when a first direction (the z-axis) is defined with reference to an optical axis, an optical device may move in the first direction (the z-axis), a second direction (the x-axis), or a third direction (the y-axis). According to one embodiment, the actuator may spatially move the optical device according to a combination of the first direction to the third direction, based on control signals from a control device in the first to third directions in the space.

Referring to FIG. 3, according to one embodiment, when a light source module includes two optical devices, electromagnetic force generated between a coil, through which current flows, and a magnet generating a magnetic field may be used to adjust the distance between a first optical device and a second optical device. The type of actuator may be a mechanical type or a circuit type in which the actuator is capable of moving and controlling a diffusion part, and is not limited to a specific type.

When current flows in a coil positioned at a place in which a magnetic field is generated by a magnet, electromagnetic force may be generated and may thus push a second diffusion part upward or downward about a light path direction.

The direction in which an optical device moves may be controlled by controlling the direction of current based on a predetermined reference.

According to another embodiment, the light source module may adjust the direction or the distance between the first optical device and the second optical device by using a piezoelectric element (not shown) or a rotating device (not shown).

According to another embodiment, the light source module may further include a driving device (not shown) configured to move the optical device in a direction parallel to or perpendicular to the light path.

According to one embodiment, the light source module may include a voice coil motor (VCM), and may move the optical device by using a Ferro magnet and a Ferro magnet bar.

[Functions of Voice Coil Motor (VCM)]

Referring to FIG. 1, according to one embodiment, the actuator 130 may use a voice coil motor (VCM) to move an optical device.

According to one embodiment, the actuator 130 may move a diffusion device in a light path direction by using interaction between a coil 131 and an electromagnet 133 or between a piezoelectric element (not shown) and a metal material (not shown). The movement of the diffusion device in the light path direction may be defined as a vertical movement function.

The voice coil motor used in the actuator 130 moves an object by using electromagnetic force generated by interaction between the coil and the magnet.

Referring to FIG. 3, when the light source module 300 includes two optical devices, one optical device 320-1 may be fixed, and the other optical device 320-2 may include a coil or an electromagnet. Electromagnetic force may be generated by a coil 331 in which current flows, and the distance between the two optical devices may be adjusted by electromagnetic interaction between a magnet 333 and the coil, included in the optical device. The accurate distance between the two optical devices, the increase or decrease in the relative distance therebetween, and the direction of movement of the optical devices may be determined based on the intensity and direction of current flowing in the coil.

According to another embodiment, amplification of an electromagnetic field by the coil may be determined based on a piezoelectric effect, and the distance between the two optical devices may be adjusted using the electromagnetic force.

The two optical devices according to one embodiment may be defined as the first optical device 320-1 and the second optical device 320-2. An operation mode of the light source module may be defined based on the relative distance between the first optical device and the second optical device. For example, the operation mode of the light source module may be a far-distance mode or a near-distance mode.

[Function of Optical Image Stabilization (OIS)]

Referring to FIG. 1, according to one embodiment, the actuator 130 may also move a diffusion device in a direction perpendicular to the light path direction by using interaction between the coil 131 and the electromagnet 133 or between the piezoelectric element (not shown) and the metal material (not shown). When a first direction (the z-axis) is defined with reference to an optical axis, a first diffusion device may move in a second direction (the x-axis) or a third direction (the y-axis).

The radiation angle or direction of light may be adjusted as desired by using the electromagnetic interaction. In this case, the movement of the actuator may be defined as an optical image stabilization (OIS) function or a horizontal movement.

The OIS function of a typical camera is a function of, like a typical hand-trembling prevention function, correcting image blurring by moving an optical device or preventing image blurring by adjusting a signal from an image sensor.

However, contrarily to the conventional OIS, the OIS according to the present embodiment adjusts the radiation angle or direction of light, transferred to an object, by moving an optical device, and thus application target thereof differs from that of the conventional OIS. Further, the OIS according to the present embodiment is designed for accurate distance measurement through the movement of an optical device, and thus the application purpose thereof differs from that of the conventional OIS.

Figure 23:
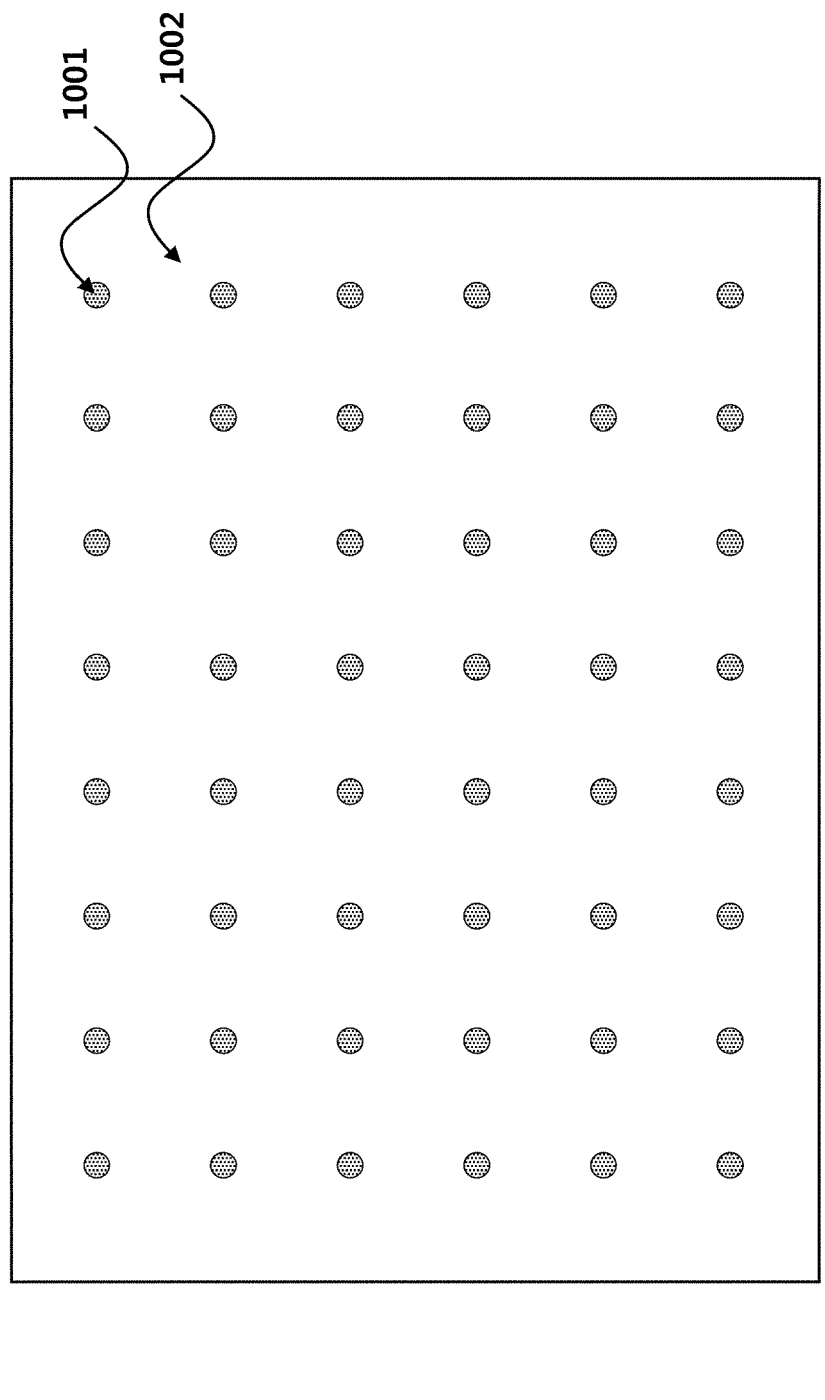
FIG. 23 is a first illustration showing a region of light, in which light transferred from a light source module according to one embodiment reaches a subject.
Figure 25:
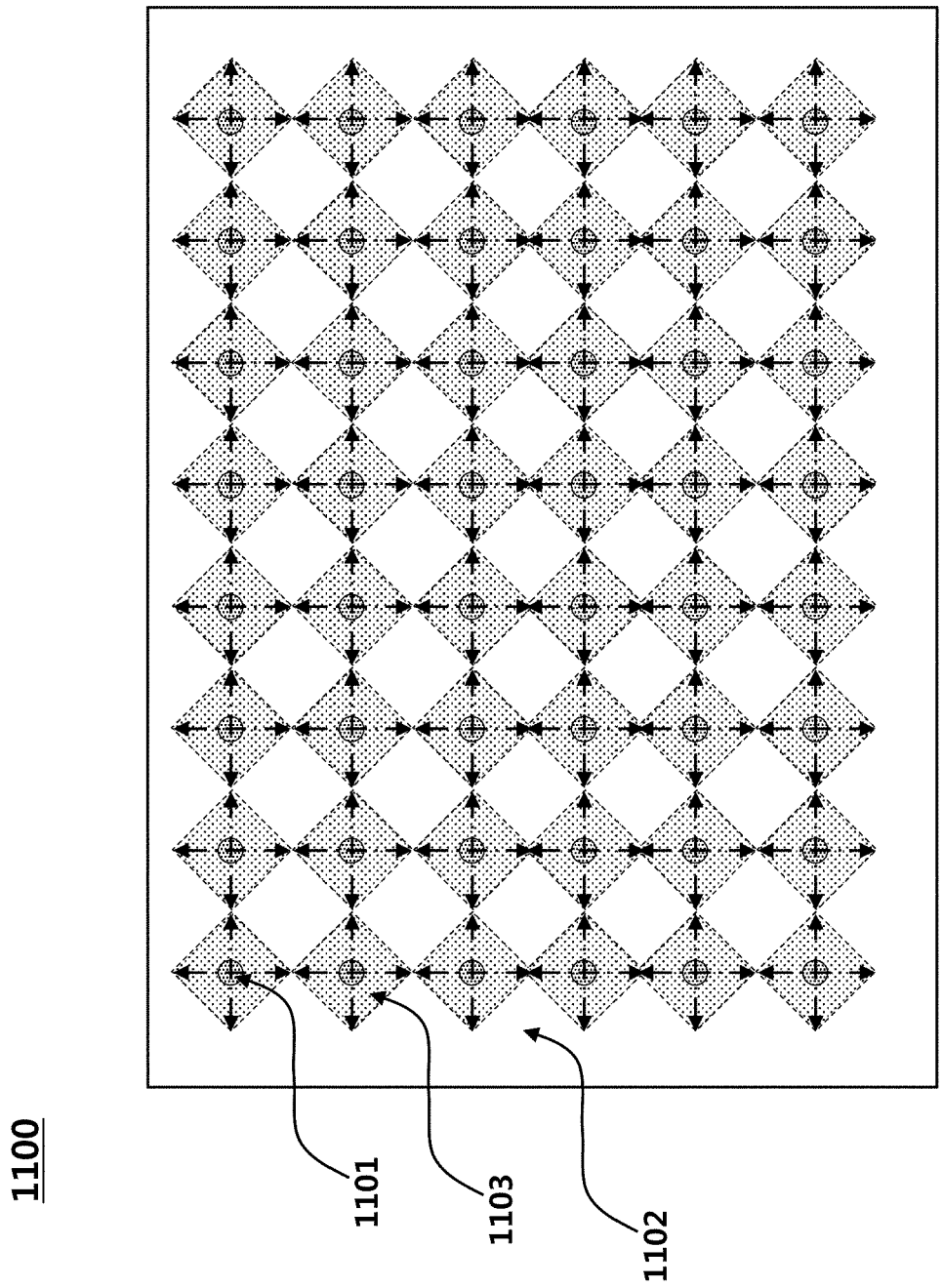
FIG. 25 is a third illustration showing a region of light, in which light transferred from a light source module according to one embodiment reaches a subject.

Referring to FIGS. 23 and 25, according to one embodiment, light reaching an object in the form of a dot may be allowed to reach the object in the form of a surface through the movement of the optical device. In FIG. 23, a point light source region 1101 may be defined as a region of light which reaches an object and has intensity equal to or stronger than a predetermined intensity. FIG. 23 shows light arrival distribution in a typical light source module which has no OIS function. FIG. 25 shows light arrival distribution when a surface light source is generated through an OIS function. Generating a surface source region 1103 enables higher resolution and more accurate distance calculation.

Figure 24:
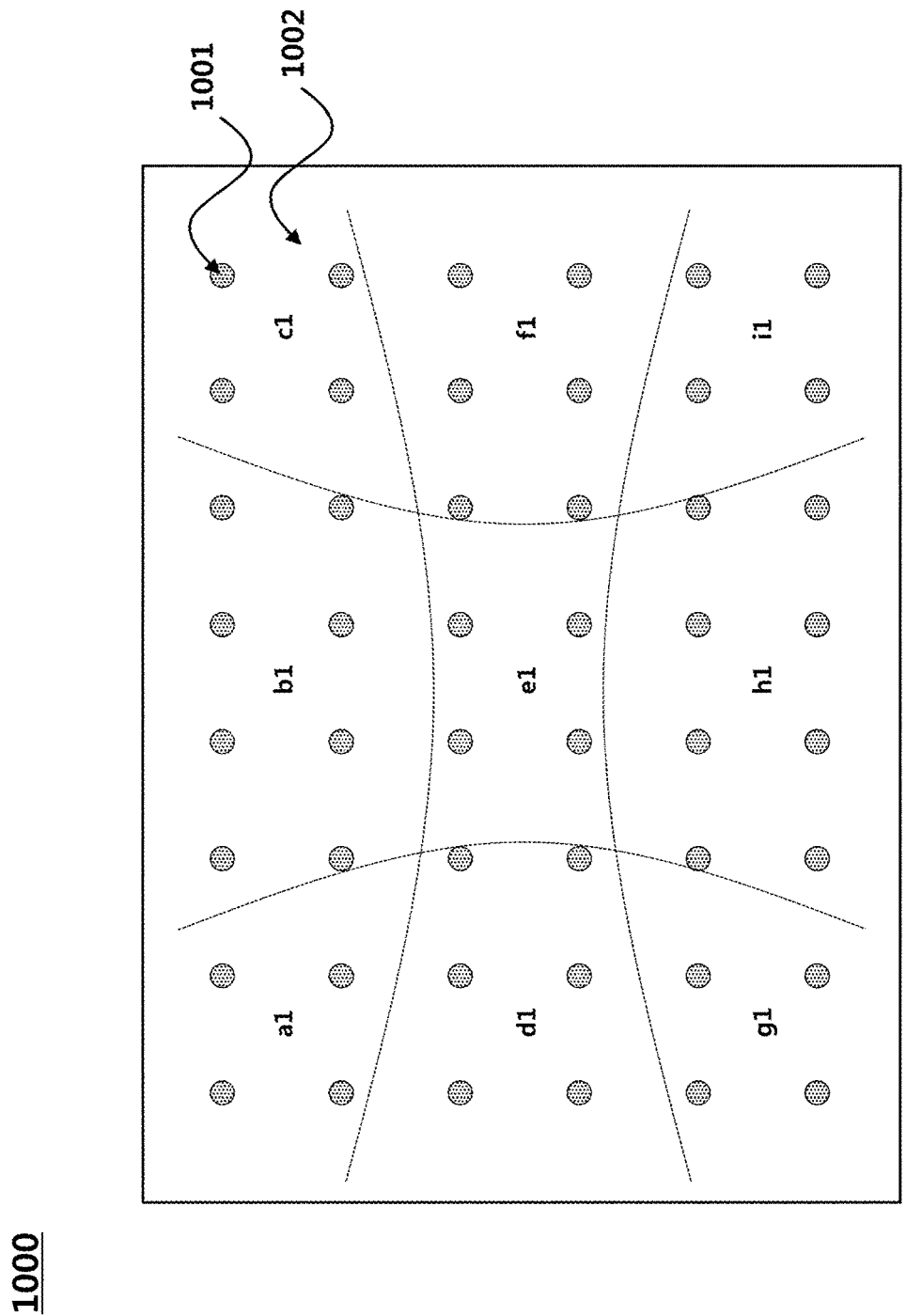
FIG. 24 is a second illustration showing a region of light, in which light transferred from a light source module according to one embodiment reaches a subject.

Referring to FIGS. 23 and 24, when a single light source element is used, usable power is limited, and thus the same object is allowed to be divided into regions, the number of which is equal to the number of regions of an optical device, and to be then recognized. This may be defined as a first feature of an OIS system of the light source module. The above-described function may be implemented through the movement of the optical device in the limited region in FIG. 12.

The OIS function in FIG. 25 may be a function of moving an optical device within a predetermined range in order to generate a surface light source, while the OIS function in FIG. 24 may divide an object into regions and sequentially transfer light to the regions, thereby increasing the amount of light reaching the object. Further, when a plurality of light source elements are used, the resolution of an image may be increased by forming a radiation angle corresponding to each region. This may be defined as a second feature of the OIS system of the light source module. The above-described function may be implemented through the movement of the optical device illustrated in FIGS. 9 to 11, 13, and 14.

[Surface Light Source Generation according to First Feature of OIS Function]

According to one embodiment, when the number of a plurality of light source elements is equal to or has a correspondence relationship with the number of regions of an optical device, the accuracy of distance measurement may be increased by the movement of the optical device. For example, when the optical device does not move, light reaching an object may be formed in the form of a dot or as a small region on the object, but on the other hand, when the optical device moves, light may be formed in the form of a surface or as a large region on the object.

Referring to FIG. 23, light reaching an object may form a dot or a small region 1001. The distance from a region 1002 of the object, which light does not reach, may not be measured. Therefore, the light source module may increase the resolution of an image of the object or may accurately measure the distance from the object by increasing a region which light reaches or by reducing a region which light does not reach.

According to one embodiment, light reaching the object may form not a dot but a surface through the movement of the optical device. An area generated due to the movement of the optical device may be called the surface light source 1103. In the light source module, a space is limited and the direction of movement is limited, and thus the area of a generable surface light source is limited. In the case of the conventional distance measurement devices, there is no attempt to increase a resolution through the movement of an optical device, and thus the above-described problem of arrangement has not been considered.

According to one embodiment, light source elements or apertures may be formed in a zigzag type in order to increase efficiency of the area of a surface light source and reduce a region which light does not reach. In this case, more densely spaced light beams may reach an object. For example, apertures may be formed in the plurality of light source elements of a light source part, and the apertures may be arranged according to the rule established to adjust the position of light reaching an object. The established rule is not limited as long as the rule is designed to increase the density of regions which light reaches.

Figure 26:
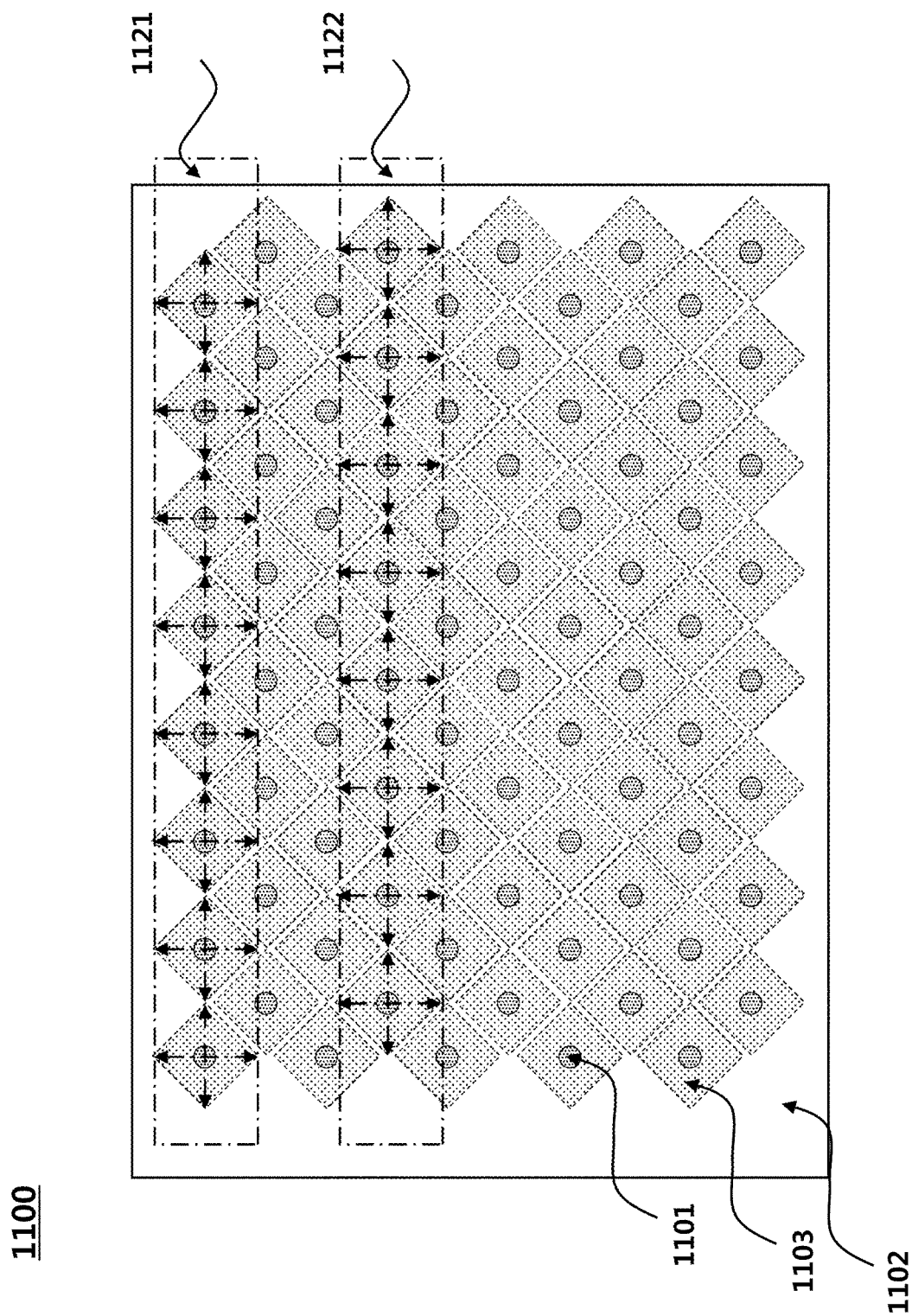
FIG. 26 is a fourth illustration showing a region of light, in which light transferred from a light source module according to one embodiment reaches a subject.

Referring to FIG. 26, for example, regions which light reaches may be classified into a first region 1121 which light reaches and a second region 1122 which light reaches. The first region which light reaches may be an odd-numbered region according to the arrangement of the regions, and the second region which light reaches may be an even-numbered region according to the arrangement of the regions. In another example, light source elements and apertures may be formed such that regions which light reaches are arranged in the form of a checkerboard.

[Region-Specific Sensing According to Second Feature of OIS Function]

As illustrated in FIGS. 5 and 9, according to one embodiment, a plurality of separate regions of an optical device may be defined according to a region of light reaching a subject, and a single light source element may be used to allow light to pass through the plurality of separate regions of the optical device.

Referring to FIG. 24, according to another embodiment, a plurality of light source elements may be used to allow light to pass through the plurality of separate regions of the optical device.

As described later, light may be transferred to an object from each of the plurality of separate regions of the optical device according to the movement of the optical device, illustrated in FIG. 5, and final image data or distance data may be acquired with regard to divided regions of the object.

The region-specific sensing may be implemented by a light source module including a single light source element, or may be implemented by a light source module including a plurality of light source elements as necessary.

For example, in an optical device divided into nine regions, when line scanning is performed with respect to three channels by using three light sources, an operation time may be reduced to a third of that in the case of emitting light by using one light source. The number of light source elements may be adjusted or designed in consideration of economical efficiency, the size of a light source module, and limitation conditions of an actuator system.

In another example, an optical device may have a plurality of light sources, the number of which is equal to the number of a plurality of regions of the optical device. When the plurality of light sources are used, a movement distance of the optical device is reduced, and thus an operation time may be reduced. For example, the optical device may have nine light sources corresponding to nine separate regions of the optical device. A movement time of the optical device having nine light sources may be equal to or less than a ninth of an operation time of an optical device operating using a single light source.

[Region-Specific Sensing According to Beam Steering Function]

Referring to FIG. 21, the light source module 500 according to one embodiment may transfer light to an object through beam steering.

The light source module 500 according to one embodiment may include a light source 510, at least one optical device 520, an actuator 530, a frame (not shown), at least one control device 550, and a pogo pin tension 580.

The light source 510 may be one selected from among the above light sources capable of emitting light, and the type thereof is not limited. For example, the light source 510 may be vertical cavity surface-emitting laser (VCSEL).

The optical device 520 may include a plurality of optical devices. According to one embodiment, a first optical device 520-1 may be a collimator lens, and a second optical device 520-2 may be a diffractive optical element splitter.

The actuator 530 may include a coil 531, an electromagnet 533, and a yoke 535. The coil 531 and the electromagnet 533 may cause the movement of the optical device 520 by electromagnetic interaction therebetween occurring when current flows in the coil. The yoke 535 may be made of a metal material in order to increase magnetic flux density.

The actuator 530 may include a pogo pin tension, and may be defined as a separate device as necessary.

A terminal 532 may be a terminal for connection of the coil and a printed circuit board (PCB). A substrate on which a pogo pin tension is installed may be defined as the printed circuit board (PCB), and a substrate on which a light source element is installed may be defined as a substrate pad.

Figure 22:
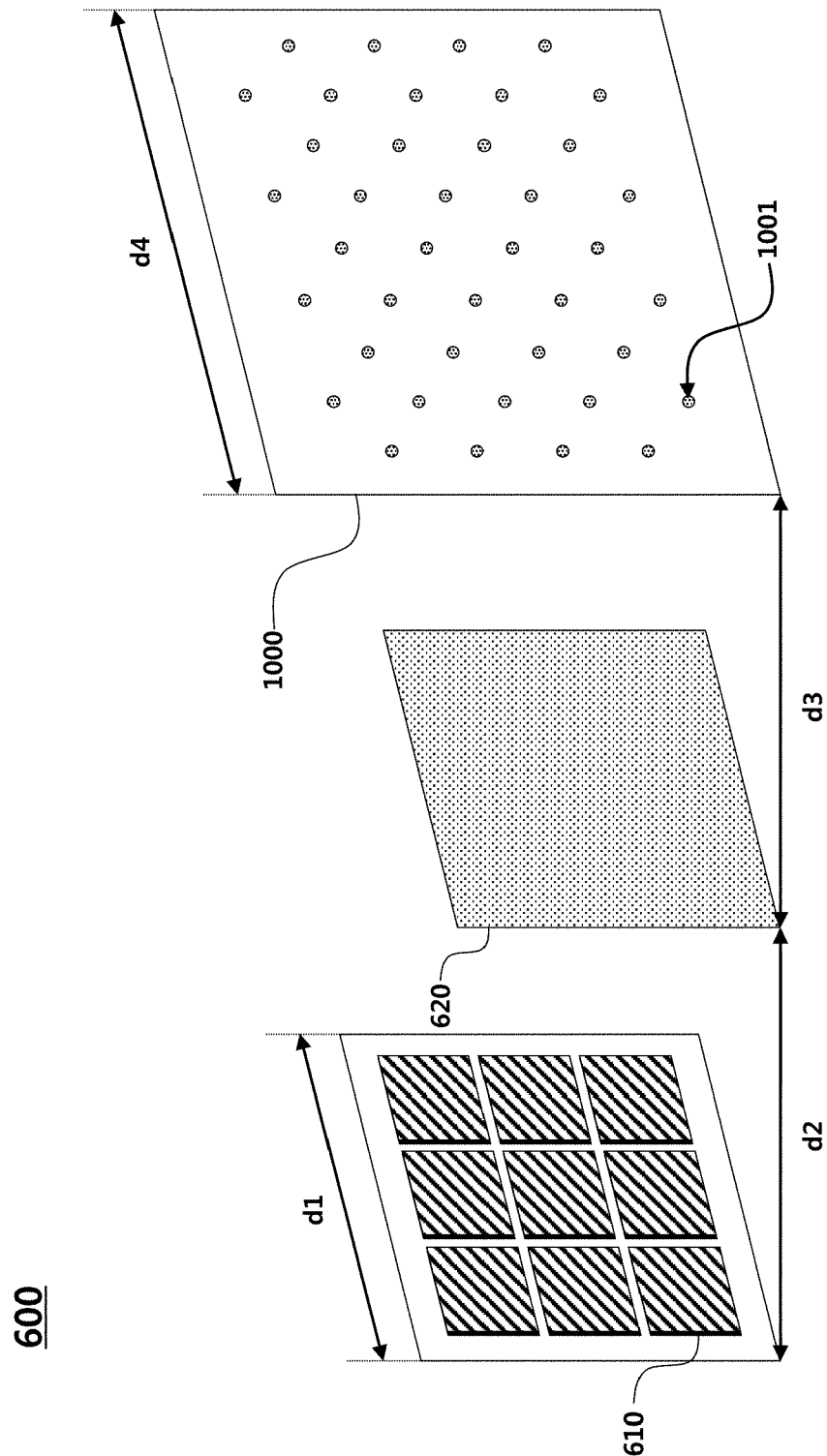
FIG. 22 is a view for describing a design drawing of a light source module.

The frame (not shown) may have the shape illustrated in FIG. 22 if the frame is designed to support or protect each element of the light source module, but is not limited thereto.

The frame (not shown) may include a flat spring 541. The flat spring 541 may provide resilience such that the actuator 530 or the optical device 520 returns to and maintains an initial position.

The control device 550 may include a processor or a controller, and may include a plurality of processors as necessary.

A first control device 550-1 may be a processor for detecting whether magnetic force is effective, and a second control device 550-2 may be a processor for identifying eye safety. The second control device may detect, using a photodetector, whether a diffractive optical element is detached.

The pogo pin tension 580 may be electrically connected to the printed circuit board and the substrate (a substrate pad) to implement beam steering.

The light source module 500 according to one embodiment may include four pogo pin tensions 580, may receive power supplied from the substrate electrically connected thereto, and may tilt the substrate (substrate pad) to change the emission angle of light.

A magnet and a coil for generating electromagnetic force may be included in each of the pogo pin tensions 580, and the plurality of pogo pin tensions may be separately controlled. When the light source module 500 includes at least four pogo pin tensions, the height of each pogo pin tension may be adjusted according to the direction and intensity of current.

When the vertical direction of the printed circuit board is defined as a z-axis direction, displacement (Theta) in the x-axis or y-axis direction in which light is transferred may be defined according to the vertical height of each pogo pin tension 580.

Relative control of an emission angle by the pogo pin tension 580 enables light emission through spatial division. In this case, an image may be acquired or a distance may be measured through division of a subject, and thus higher-quality image data or distance data may be acquired.

In the case of using a light source module having a beam steering function according to one embodiment, as illustrated in FIG. 4, light may also be transferred to a subject 399 in the state where a region 395 which light reaches is divided, and the methods described in the present specification may be used.

[Control of Actuator]

Referring to FIGS. 9 to 15, the actuator 330 according to one embodiment may receive a control signal from a control device, and may control the movement of the optical device 320 in accordance with an output change interval of the light source 310.

The movement of the optical device 320 may be controlled such that light is directed at a corresponding object. If necessary, the optical device 320 may include two optical devices, and the two optical devices may be defined as the first optical device 320-1 and the second optical device 320-2 illustrated in FIG. 5, but are not limited thereto.

For example, the optical device may move such that light passes through a region A of the second optical device 320-2 in FIG. 5, and the light having passed through the region A of the second optical device 320-2 in FIG. 5 may be transferred to a corresponding region A' within the region 395 which light reaches.

In another example, when the second optical device 320-2 in FIG. 5 moves and light passes through regions B and C in sequence, the light may be sequentially transferred to corresponding regions B' and C' within the region which light reaches.

Figure 15:
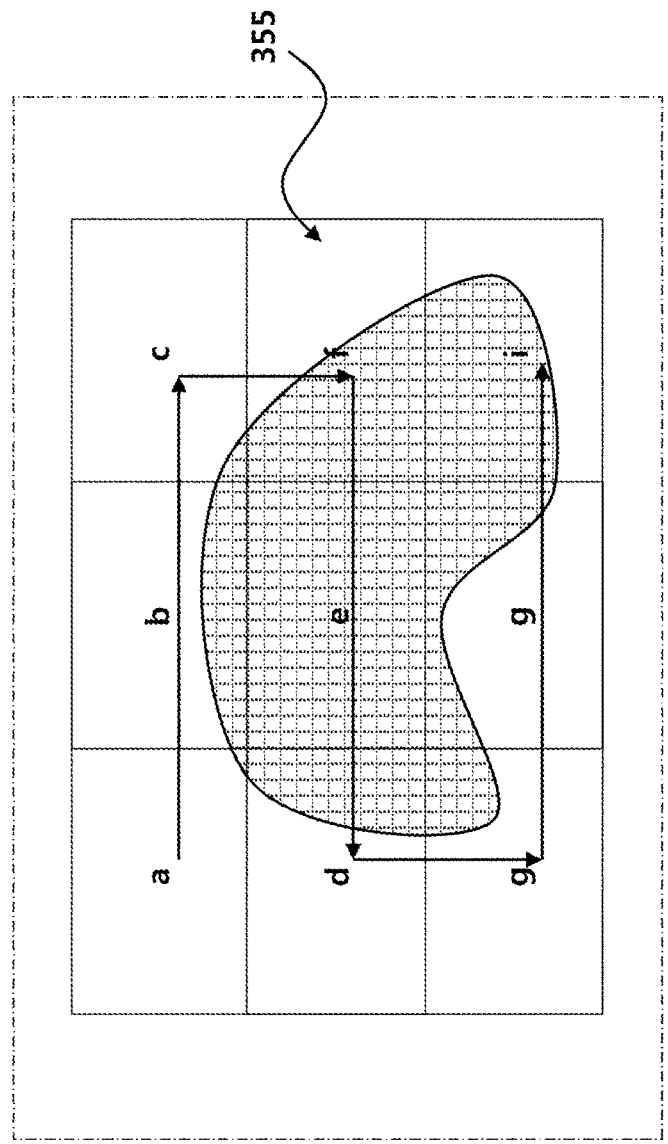
FIG. 15 is a first illustration showing the order of arrival of light in respective regions of a reception part.

Referring to FIG. 15, light, which has passed through the optical device 320 and reflected by a corresponding region of an object, may be transferred to a reception part 350. Further, the reflected light transferred to the reception part may reach separate regions 355 of the reception part corresponding to N (N being a natural number of 1 or greater) regions of the optical device.

An output change of the optical device may be made in accordance with the output change interval of the light source, and the optical device may be controlled such that light is directed at a corresponding region of the reception part. For example, the optical device may move such that light passes through the region A of the second optical device 320-2 in FIG. 5, and the light having passed through the region A of the optical device may be transferred to a corresponding region (a) in the reception part.

In another example, when the second optical device 320-2 in FIG. 5 moves and light passes through regions B and C in sequence, the light may be sequentially transferred to corresponding regions (b and c) in the reception.

A control speed of output of a light source part may be controlled in conjunction with the reception part. The control speed may be controlled based on a frame rate of a time-of-flight (TOF) camera, and may vary depending on the sensitivity of a sensor. For example, the control speed may be differently determined according to VGA, QVGA, QQVGA, etc.

Referring to FIG. 9, For example, light may pass through regions of the optical device in the order of regions A, B, C, F, E, D, G, H, and I. Power efficiency may vary according to the order in which light passes through the regions of the optical device. The order in which light passes through the regions may form one cycle such that all the regions do not overlap each other.

In another example, light may pass through the regions of the optical device in the order of regions E, F, C, B, A, D, G, H, and I. The order and direction of the movement of the optical device are an example and are not limited thereto.

The actuator 330 may include a coil, a piezoelectric element, or a rotating device. Interaction between the coil and a magnet may cause movement in a direction parallel to an optical axis (in a light path direction). Further, movement in a direction parallel to the optical axis may be caused by using the piezoelectric element. A light diffusion device may rotate using the rotating device (not shown), and, in this case, there is an advantage of reducing the kinds of processed surfaces of the optical device.

The movement of the optical device may be adjusted such that light sequentially passes through all or some of the regions. According to one embodiment, when a single light source element is used, a distance from an object may be measured by causing movements of the optical device in sequence. According to another embodiment, even in the case in which a plurality of light source elements are used, only some thereof may be used, and, if necessary, only one thereof may be used and a distance from an object may be measured by causing movements of the light diffusion device in sequence.

Figure 10:
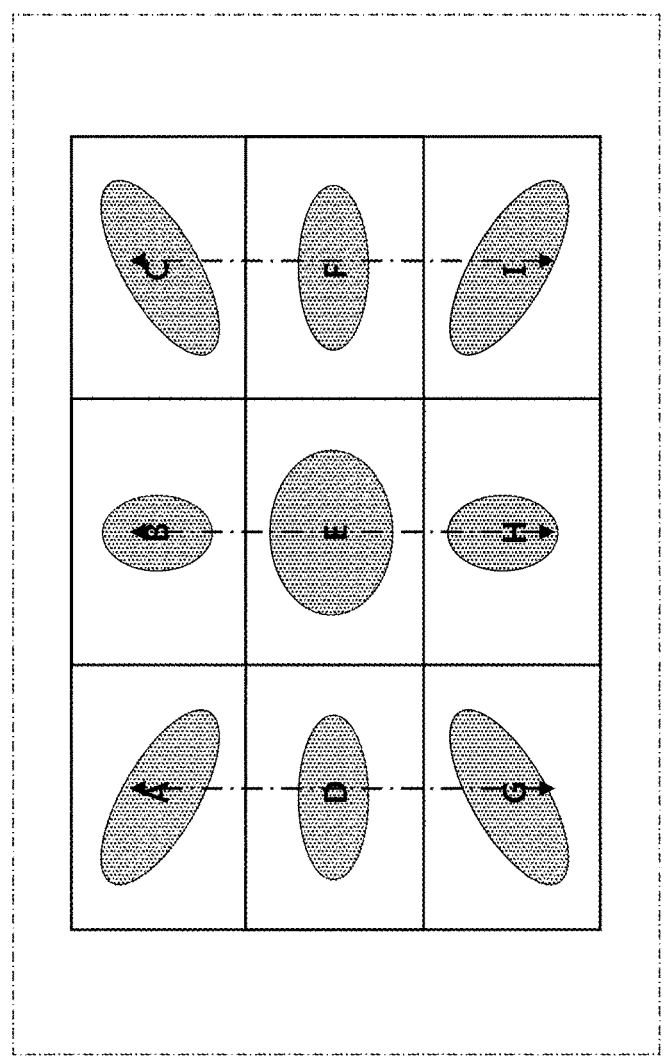
FIG. 10 is a second illustration showing region-specific movement of an optical device.
Figure 11:
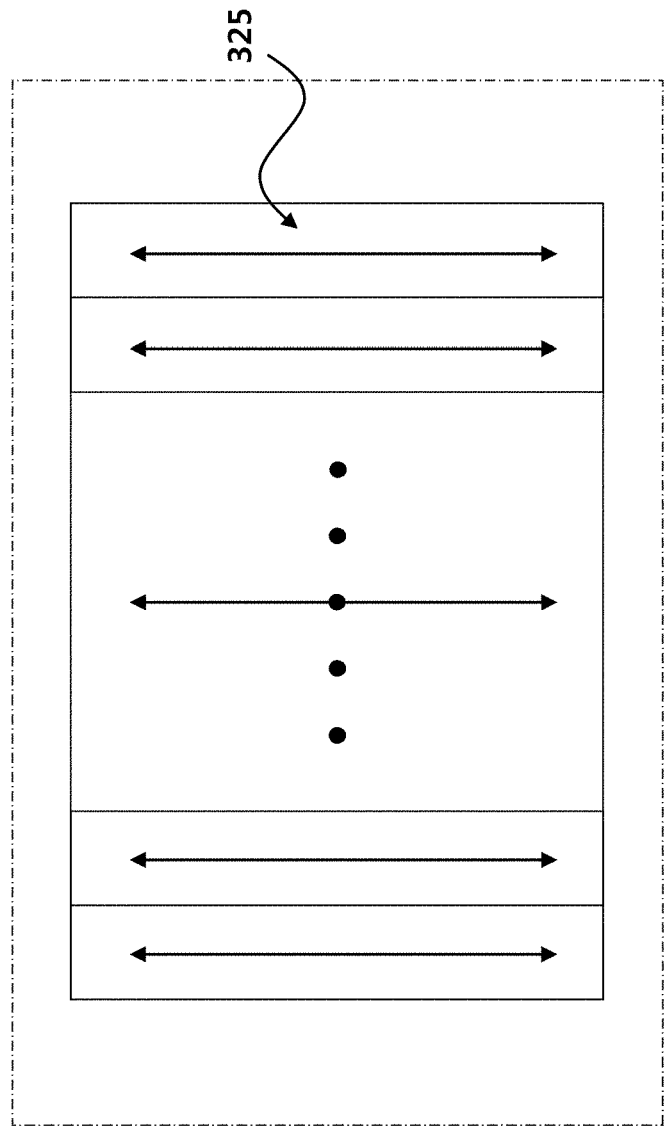
FIG. 11 is a third illustration showing region-specific movement of an optical device.
Figure 12:
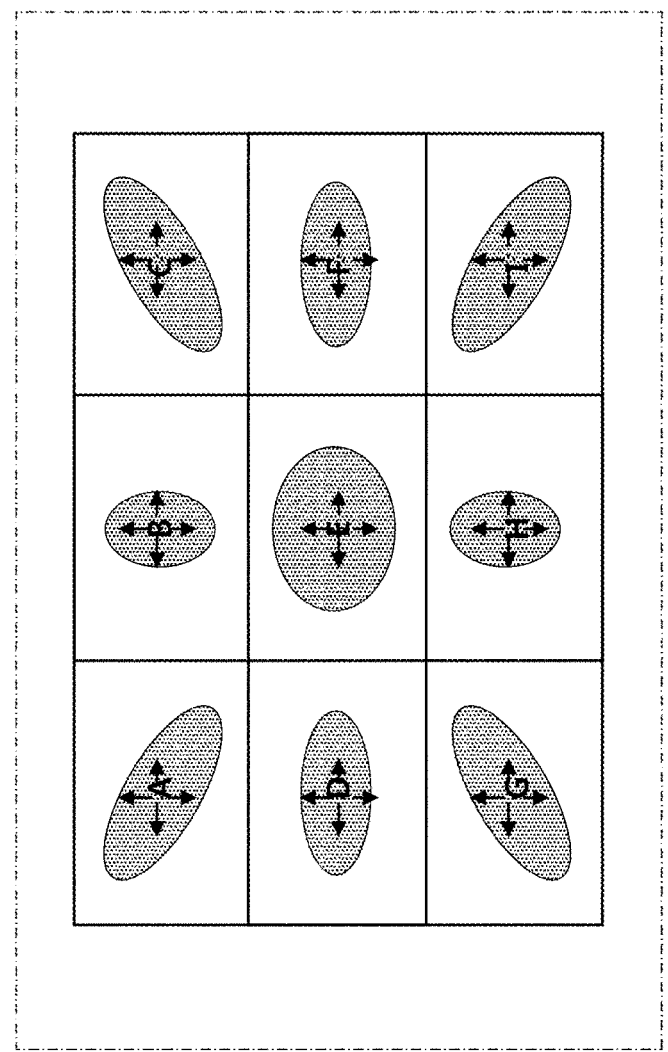
FIG. 12 is a fourth illustration showing region-specific movement of an optical device.

Referring to FIGS. 10 and 11, the use of a plurality of light source elements may have equal or higher efficiency while reducing the movement of the optical device. For example, when three light source elements are used and the optical device is divided into nine regions, the optical device may be configured to move in the upward/downward direction or in the leftward/rightward direction by using the light source elements arrayed in a line. Compared with in the case in which a single light source element is used, this case is advantageous in terms of an operation time and the resolution of an image.

Figure 13:
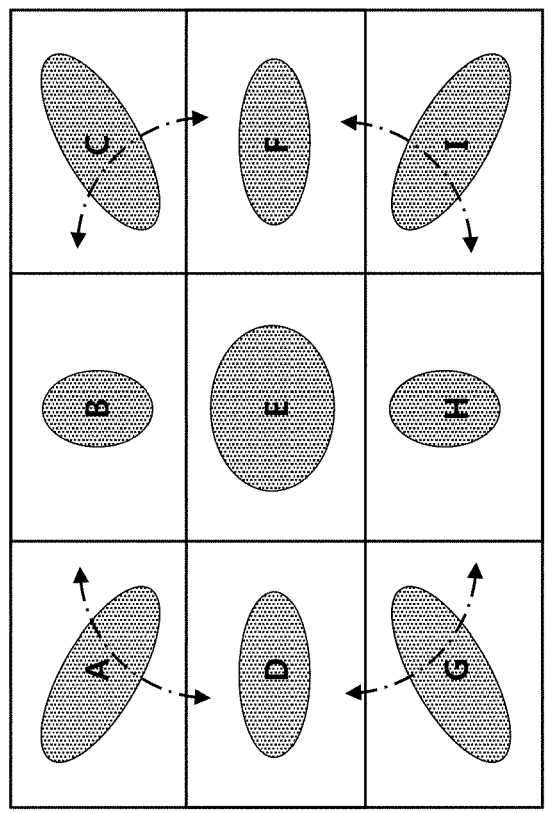
FIG. 13 is a fifth illustration showing region-specific movement of an optical device.

Referring to FIG. 13, according to one embodiment, the optical device may be rotated about an optical axis. In this case, all regions of the optical device need not be individually configured as surfaces, and symmetrical regions may be used. Further, in this case, only some regions may be repeatedly used to increase spatial efficiency of the light source module, thereby miniaturizing the device. For example, as the optical device rotates, the regions of the optical device may have symmetrical structures matching each other.

2.4 Frame

As illustrated in FIGS. 1 to 3, 17, and 21, if a frame of a light source module according to one embodiment is designed to support a light source, an optical device, and an actuator, the shape or size of the frame is not limited.

The light source module and the frame of the light source module according to one embodiment may be identical in structure to those of Korean Patent Publication Nos. and Korean Registered Patent Publication Nos. KR 10-2020-0117187 A, KR 10-2020-0107749 A, KR 10-2020-0046267 A, KR 10-2020-0033168 A, KR 10-2020-0032429 A, KR 10-2090826 B1, KR 10-2090827 B1, KR 10-2087519 B1, KR 10-2020-0014201 A, KR 10-2020-0004757 A, KR 10-2053935 B1, KR 10-1877039 B1, KR 10-1853268 B1, KR 10-1750751 B1, KR 10-2017-0065951 A, KR 10-1742500 B1, KR 10-1742501 B1, or KR 10-1538395 B1, or may include modified embodiments thereof.

2.5 Control Device

A control device according to one embodiment, which is a processor, may calculate acquired image data or distance data. Alternatively, the control device may control current in an actuator or may control current in order to control output of an optical element. The control device may be called a driving device as necessary.

The control device may include: predetermined appropriate hardware encoders, such as a computer, a microprocessor, a microcontroller, an application specific integrated circuit (ASIC), and a digital signal processor; a circuit for reading the encoders; a memory device; and/or other predetermined appropriate hardware elements. In some embodiments, each element disposed in a light source module may include its own software, firmware, and/or hardware in order to control the each element and communicate with another element.

2.6 Photodetector

According to one embodiment, in order to detect the movement or position of an optical device according to the movement of an actuator, a light source module may include a photodetector.

The photodetector may be disposed to directly receive light output from a light source, and may measure the intensity of the light output from the light source. The photodetector, which is a device capable of measuring the intensity of light output from a light source, is not limited. Specifically, the photodetector may be a photodiode, or a photoelectric device formed as a pattern.

The photodetector may measure the intensity of reflected light, and may transmit a value of the light intensity to a processor. The processor may determine whether the measured light intensity is outside a predetermined reference range, and may operate in an eye-safety mode to limit output of the light source.

The photodetector may receive light emitted from a light source element, and may sense a change in a current value. The photodetector may detect, based on the change in the current value, the movement or position of the light source module.

The photodetector may control, based on the change in the current value, the movement of the actuator through a control device or a processor.

The movement or position of the actuator or the optical device, which can optimize the performance of the light source module, may be calculated based on data measured by the photodetector according to one embodiment.

Receiving (Rx) Module 3.1 Configuration of Reception Part

A reception part according to one embodiment may include image sensor, an infrared (IR) filter, and lens. The infrared filter may restrict the transmission of infrared light, and the lens may refract or focus light. The lens may play the role of focusing or diffusing light according to the type thereof, but the type of the lens is not limited.

The reception part may include image sensor, such as a charge-coupled device (CCD), a complementary metal oxide semiconductor (CMOS), etc.

3.2 Region of Reception Part

The reception part according to one embodiment may be divided into one or more regions, and may recognize light which reaches and is then reflected by corresponding regions of an object. Further, in relation to the reflected light transferred to the reception part, the regions of the reception part may be defined such that the same can correspond to a plurality of regions of an optical device.

Figure 16:
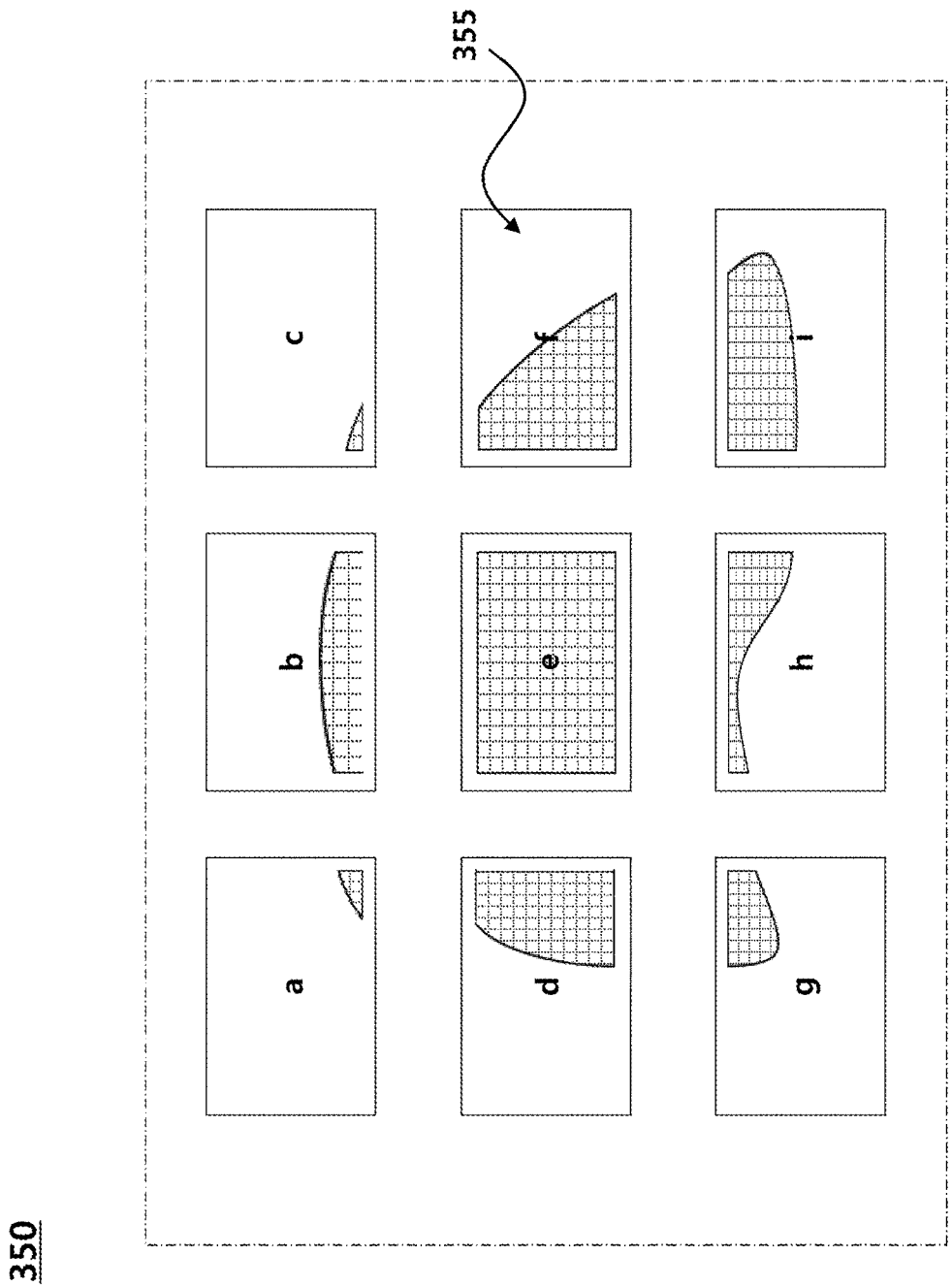
FIG. 16 is a second illustration showing the order of arrival of light in respective regions of a reception part.

Referring to FIGS. 15 and 16, a portion of an object, corresponding to each of the separate regions 355 of the reception part 350, may be recognized. For example, in the case of the region (a), a portion of the left upper end of the object may be recognized.

Referring to FIGS. 4 and 5, the order of recognition by regions of a reception part according to one embodiment may correspond to the movement of the optical device. For example, when light passes through the regions of the optical device 320 in FIG. 9 in the order of regions A, B, C, F, E, D, G, H, and I, the regions of the reception part 350 in FIG. 15 may recognize light in the order of regions a, b, c, f, e, d, g, h, and i.

High-Density Beam Radiation Using Collimator Lens and OIS function 4.1 Limits of Conventional Technology Due to a normal need for the miniaturization of a light source module, the movement distance of light relative to a field of view (FOV) in the light source module is limited. Therefore, in the case of the field of view (FOV) primarily adjusted by the inner diameter and design value of an aperture of the vertical cavity surface-emitting laser (VCSEL), power defined in the vertical cavity surface-emitting laser (VCSEL) may be output as it is, thereby causing an eye-safety-related problem such as a damage to a user's eye, and the same is not enough to make homogeneity and field of view required by a system.

In order to overcome the above structural limit and implement optical performance to solve the problems of a field of view relative a movement distance and eye-safety, it is normal for a light source module to necessarily include at least one optical device.

Referring to FIG. 7, the intensity and angle of light emitted from an optical element 310C may be primarily adjusted by a lens of a vertical cavity surface-emitting laser (VCSEL), and the field of view of light transferred to the optical device 320 may be secondarily adjusted. The optical device may be a micro-lens array (MLA), a diffractive optical element (DOE), or a collimator lens, and an element capable of homogenizing light may be adopted as the optical device without any limitation.

Conventional light source modules necessarily require an optical device in order to diffuse or homogenize light transferred from a light source to a subject, and thus, under predetermined power, the intensity of light output and the distance to which light reaches are limited.

Therefore, in the process of light homogenization using a micro-lens array (MLA) or a diffractive optical element (DOE), the efficiency of transmitted light is reduced, and, in the process of transferring in the form of a surface light source, the light efficiency is rapidly reduced according to a distance.

The optical device of the convention light source module acts as optical resistance. Thus, in acquiring information about the distance and depth of an object present at a far distance, the amount of light reaching the object becomes insufficient, and the intensity of light reaching the object per unit area is reduced by the field of view (FOV) increased in the optical device.

Therefore, the optical device of the conventional light source module has a limit in measuring an object present at a far distance. Further, when the conventional light source module necessarily requiring an optical device for light homogenization is used, the resolution and sensitivity of a depth image or an image incident onto a sensor may be reduced and thus optical noise may be rapidly increased.

Further, the conventional optical device merely diffuses light, transferred from a single vertical cavity surface-emitting laser (VCSEL), for light homogenization, and thus the direction of light, transferred from each of a plurality of laser elements present at different positions, and characteristics of the positions of the laser elements may not be considered. For example, when nine vertical cavity surface-emitting lasers (VCSELs) are arranged in a 3×3 array, consideration may not be given to the transfer direction of light and the positional characteristics of laser elements according to the arrangement of a laser element present at the center portion and laser elements present at the outer periphery.

Further, the conventional optical device is fixed to a frame (not shown) and thus is not moved, and may not adjust the incident position or angle of a beam according to the physical position or distance between the vertical cavity surface-emitting laser and the optical device.

4.2 Light Source Module Including Collimator Lens

A light source module according to one embodiment may include a light source and a collimator lens.

The collimator lens may adjust the movement distance or angle of the light source to an object to increase light efficiency. The shape, size, arrangement, or the like of the collimator lens may be adjusted, based on a predetermined reference, according to the amount of light at a target point. Further, a plurality of collimator lenses may be used as necessary.

The collimator lens may adjust a change in the field of view (FOV) of light passing therethrough, and may maintain radiation of high-density spot beam. A collimator lens according to one embodiment may prevent high-density light, transferred from a vertical cavity surface-emitting laser (VCSEL), from being transferred in the form of a surface light source (for example, in a flood type) as a result of passing through an optical device such as a micro-lens array (MLA) or a diffractive optical element (DOE), and may convert the high-density light into a high-density spot beam and radiate the beam.

4.3 Working Distance Adjustment of Light Source Module

The distance between a vertical cavity surface-emitting laser (VCSEL) and a collimator lens may be defined as a working distance, and the working distance between the vertical cavity surface-emitting laser and the collimator lens may be adjusted by a driving device (not shown).

In a near-distance mode in which a distance from an object present at a near distance is measured, the center of an aperture array of a vertical cavity surface-emitting laser (VCSEL) may be aligned with the center of a collimator lens. The center of the aperture array and the center of the collimator lens, which are criteria of alignment, may be defined according to a predetermined reference.

When a direction in which light is transferred between an object and a light source element is defined as a Z-axis direction, x-axis and y-axis directions perpendicular to the direction in which light is transferred may be defined.

According to one embodiment, in a near-distance mode, the driving device (not shown) may restrict the x-axial and y-axial movement of the collimator lens. In this case, the driving device (not shown) may move the collimator lens in the z-axis direction to adjust the working distance.

The position of the collimator lens may be adjusted such that the distance between the center of the aperture array and the center of the collimator lens is shorter or longer than the working distance determined in far-distance mode by vertical movement of the collimator lens in the z-axis direction.

In this case, unlike the form and boundary of a beam emitted in far-distance mode, the form and boundary of a beam are not clear and may be converted into a form similar to the form of a surface light source.

According to one embodiment, in near-distance mode, a single vertical cavity surface-emitting laser (VCSEL) may be used, and a vertical cavity surface-emitting laser (VCSEL) present at the center may be used for ease in an optical design.

Another embodiment may provide a light source module wherein, in a far-distance mode, the working distance from a vertical cavity surface-emitting laser to a collimator lens or a micro-lens array (MLA) is fixed, and a driving device is used to make a movement on a two-dimensional plane of the x-axis and the y-axis such that the resulting relative light centric control between the vertical cavity surface-emitting laser (VCSEL) and the optical device changes/controls the emission path.

Another embodiment may provide a light source module wherein, in near-distance mode, a driving device is used to adjust the working distance prefixed in far-distance mode in terms of z-axis emission direction or position, thereby implementing at least one function of converting a high-density spot-type beam into a blurred homogeneous beam.

According to one embodiment, in far-distance mode, in order to radiate beams onto a plurality of large-area regions with reference to the center of the aperture array and the center of the collimator lens, which have been aligned with each other in a far distance, the driving device (not shown) may restrict the movement of the collimator lens in a light path direction. For example, the driving device may restrict the z-axial movement of the collimator lens which is a vertical movement thereof.

According to one embodiment, in far-distance mode, the driving device (not shown) may move the collimator lens in the X-axis and Y-axis directions in the light source module. In this case, light transferred from an aperture of the vertical cavity surface-emitting laser does not passes an optical device other than the collimator lens, and thus a high-density beam may be radiated to a subject present at a far distance.

According to another embodiment, the light source module may include a plurality of collimator lens, and may include a plurality of vertical cavity surface-emitting lasers (VCSELs).

A near-distance mode or far-distance mode mechanism used by the light source module may be configured differently according to the distance or position of a subject.

According to another embodiment, a driving control device and a collimator lens may not be included in the light source module, and a micro-lens array (MLA) having a fixed working distance as a conventional connection structure may be connected. In the light source module, a plurality of aperture regions of a light source are formed, and emitted beams are incident onto corresponding regions into which the micro-lens array (MLA) is divided, and is sequentially or simultaneously emitted and projected onto corresponding regions of a final large-area subject, whereby light can be more efficiently transferred.

When a micro-lens array is used as the conventional diffuser or a diffractive optical element is used as a beam splitter, a beam is processed into the form of a surface light source, and thus focused beams or light may not be transferred to some regions.

According to one embodiment, a focused high-density spot beam may be transferred to a subject through the light source module.

The focused high-density spot beam may be included in a first light-reaching region, and a spot may have a circular shape, but the shape thereof is not limited.

The spot may be defined as a set of beams having definition or intensity equal to or higher than predetermined definition or intensity.

Referring to FIG. 24, according to one embodiment, when a plurality of light source elements are used, a region of light reaching a subject may be divided into a plurality of regions. For example, the region of light reaching a subject may be divided into a1, b1, c1, d1, e1, f1, g1, h1, and i1. Lines on boundary surfaces may be imaginary lines which can be differentiated according to a predefined reference, the intensity of light intensity, or the distribution of image data.

According to one embodiment, when the collimator lens is moved by the driving device (not shown), the region of light reaching the subject may increase. According to one embodiment, when the collimator lens moves in a direction parallel to or perpendicular to a light path, the region of light reaching the subject may also be defined according to such movement.

For example, a second light-reaching region may be defined according to movement in the x-axis or y-axis direction with reference to the center of the aperture array of the light source element and the center of the collimator lens. In another example, when movement in the z-axis direction occurs due to the adjustment of a working distance, the second light-reaching region may be newly defined.

According to one embodiment, the intensity of light reaching an object in far-distance mode may be shown in the form of a spot at which light focuses on a predetermined region and the density of light is high, and a target spot may be distinguished based on a predetermined reference. For example, the predetermined reference may be a predetermined light intensity or a predefined value, but is not limited thereto.

According to one embodiment, in far-distance mode, in order to have a high-density spot beam, an image, acquired by adjusting the working distance between the light source and the lens as desired, may be identified.

According to one embodiment, in near-distance mode, a high-density spot beam in far-distance mode has large-area homogeneity by adjusting the working distance, and a function of acquiring depth distance information at a relative near distance may be implemented by reducing the intensity of light.

According to one embodiment, the distribution of a beam according to beam divergence by input current changing within a range of 1 A to 3.5 A may be shown.

A description of beam distribution may be made by defining the width of a graph by using full width at half maximum (FWHM), but is not limited thereto.

On the basis of a beam change according to a change in input current of the vertical cavity surface-emitting laser (VCSEL), beam divergence distribution, which changes according to a change in the x-axis direction or the y-axis direction, may be measured. A light source module according to one embodiment may include: a light source; an optical element including a collimator lens; and a driving device configured to move the light source and the optical element relative to each other.

The driving device of the light source module may adjust a movement position of a driving body according to a change in beam divergence of an aperture by current input to a light source part.

The light source module may additionally include a processor configured to adjust a working distance according to beam divergence of an aperture by input current of the light source part thereof.

The light source module according to one embodiment may further include: a reception part including a lens and an image sensor; and a processor configured to determine the field of view detected by the reception part.

The reception part may detect a field of view in which a beam emitted while passing through an optical element including a collimator lens is projected on a large-area subject, and the processor may determine whether the field of view detected by the reception part corresponds to a reference field of view, and may transfer an electrical signal to a driving body.

The position of the driving body may be adjusted according to a change in beam divergence by input current of the light source part. The field of view in which a beam is projected on the large-area subject may change in proportion to the beam divergence of an aperture, and may have a predetermined correlation with the beam divergence. For example, the amount of a change in the field of view in which a beam is projected on the subject is in proportion to the amount of a change in the beam divergence of an aperture, and the radiation angle of light emitted from the light source part may be more precisely controlled by calculating the amount of each change.

According to one embodiment, a change in the beam divergence of an aperture may be measured based on a change in input current of the light source part of the light source module. A working distance may be adjusted by calculating the amount of a change in the beam divergence.

According to one embodiment, control may be performed by measuring or predicting the amount of a change in a beam divergence of an aperture according to a change in input current and thereby optimizing information regarding a field of view at which light reaches a subject.

According to another embodiment, control may be performed by measuring or predicting the amount of a change in a beam divergence of the aperture according to the temperature of external air or the like and thereby optimizing information regarding a field of view at which light reaches the subject.

By using information about beam divergence in the transmission part and the field of view at which light reaches the subject, it is possible to consider the intensity of light from the transmission part and control the amount of light reaching a sensor of the reception part.

According to one embodiment, when the beam divergence is adjusted by adjusting the working distance, the intensity or density of light projected on a large area of the subject may be adjusted, and thus the saturation of the sensor of the reception part may be prevented.

More excellent distance measurement data may be acquired by performing calibration using the above data.

The beam divergence may be defined according to the shape or profile of a beam.

Calibration of Light Source Module 5.1 Calibration of Transmitting Module

[Causes of Error Occurrence in Distance Measurement]

Figure 31:
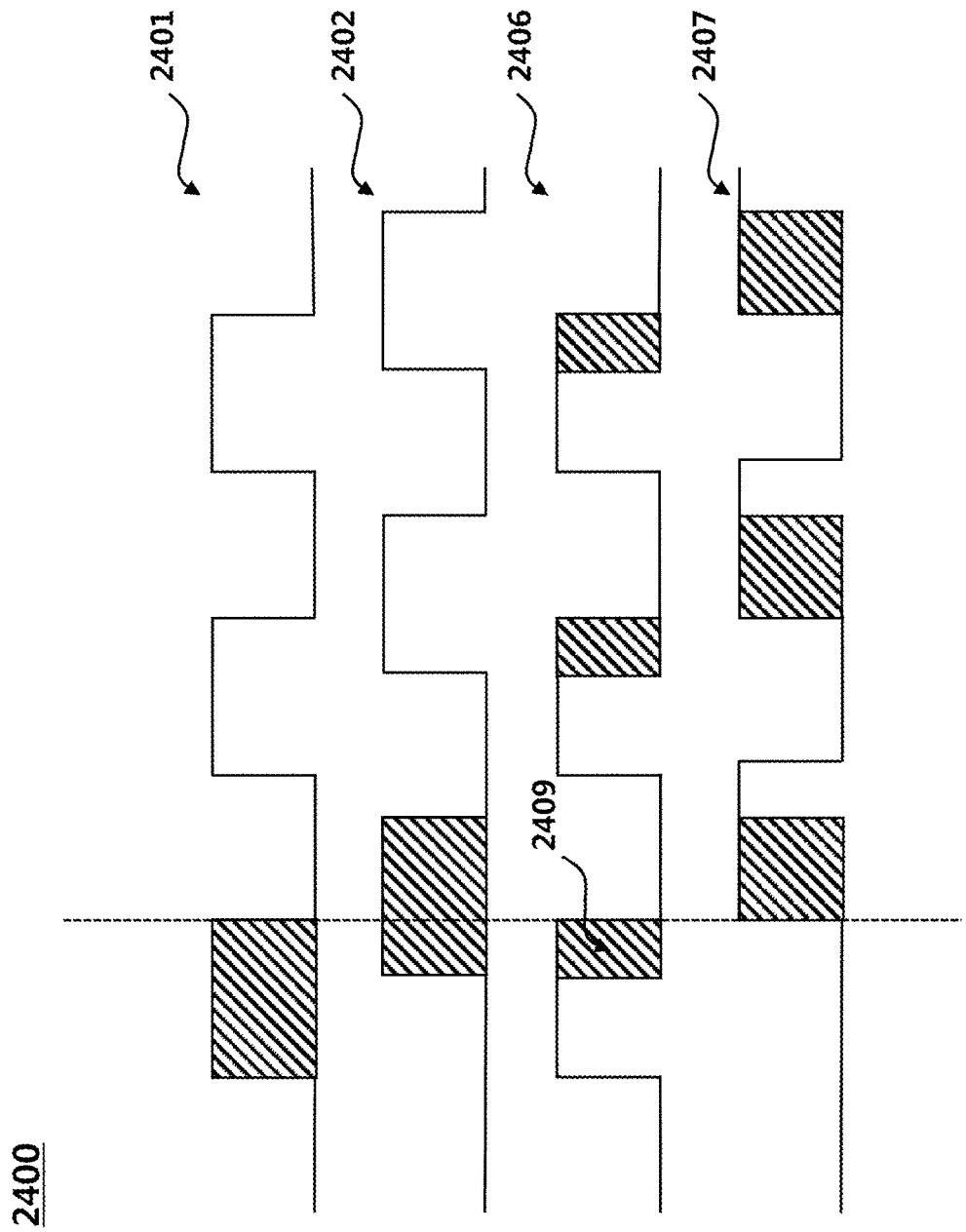
FIG. 31 is a first illustration for describing a method for measuring a distance by using a time-of-flight (TOF) method.

Referring to FIG. 31, laser beams having a predetermined pulse 2401 are repeatedly generated using a time-of-flight (TOF) method and are emitted to an object. A distance may be measured by calculating the time taken for arrival of a pulse 2402 reflected back by the object. A control device (not shown) may open or close a shutter of a sensor in a reception part. A pulse 2406 is measured by the shutter of the reception part that is opened or closed at the same time a light source of a transmission part is turned on and then turned off. A control unit (not shown) may open or close the shutter of the sensor in the reception part at the time at which the light source of the transmission part is turned off, and, in this case, another pulse 2407 is measured.

A distance of the object may be measured by calculating a partial region 2409 of the pulse 2406.

Figure 32:
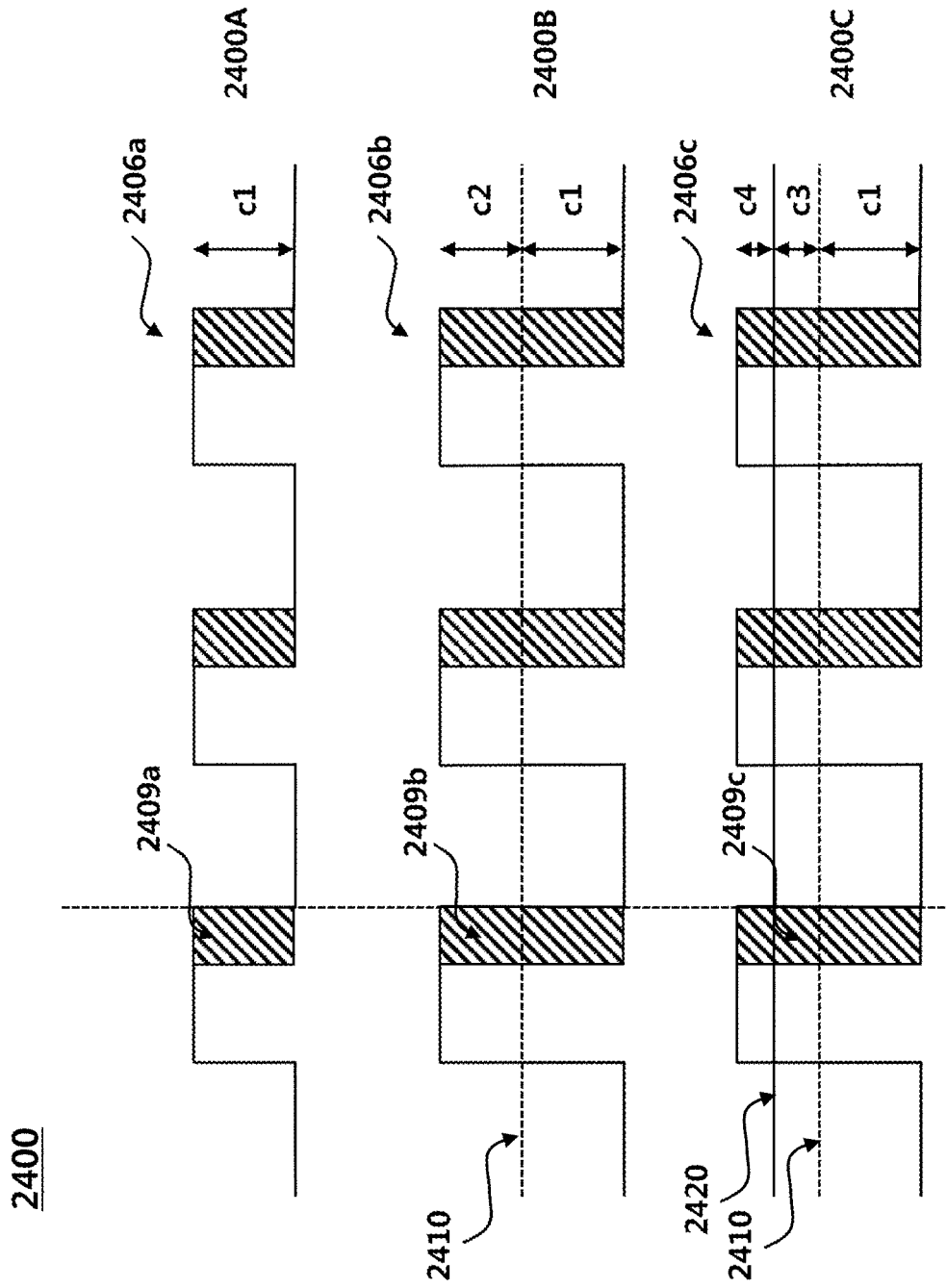
FIG. 32 is a second illustration for describing a method for measuring a distance by using a time-of-flight (TOF) method.

FIG. 32 is a view for describing a principle in which, in the case of measuring a distance by using the TOF method, the distance is not accurately measured in the reception part.

Referring to FIG. 32, a distance of an object may be measured by calculating a partial region 2409a of a pulse 2406a.

A pulse 2406b is an example of a pulse having a larger amount of charge than the pulse 2406a. According to one embodiment, the intensity of emitted light varies according to positions on the object, and thus the intensity of reflected light also varies according to the portions on the object. The intensity of reflected light at the center portion of the object is stronger than that at the peripheral portion thereof. Thus, the amount of charge, which is generated by the reflected light at the center portion and is measured in the reception part, is larger than the amount of charge which is generated by the reflected light at the peripheral portion and is measured in the reception part.

A reference line 2410 indicates a difference c2 between the pulse 2406a and the pulse 2406b, which is attributed to the relatively strong intensity of received light compared with the case of the pulse 2406a.

A pulse 2406c is an example of a pulse having a larger amount of charge than the pulse 2406a. According to one embodiment, when the intensity of reflected light is larger than a reference value which can be measured by the sensor of the reception part, the amount of charge is saturated in the reception part, and thus the distance of the object may not be accurately measured.

A reference line 2420 indicates a reference value which can be measured by the sensor of the reception part. According to one embodiment, an error occurs in measuring the distance of the object by a difference c4 between the reference value and an actual intensity of reflected light.

[Difference of Intensity of Light According to Position on Light Source]

Figure 27:
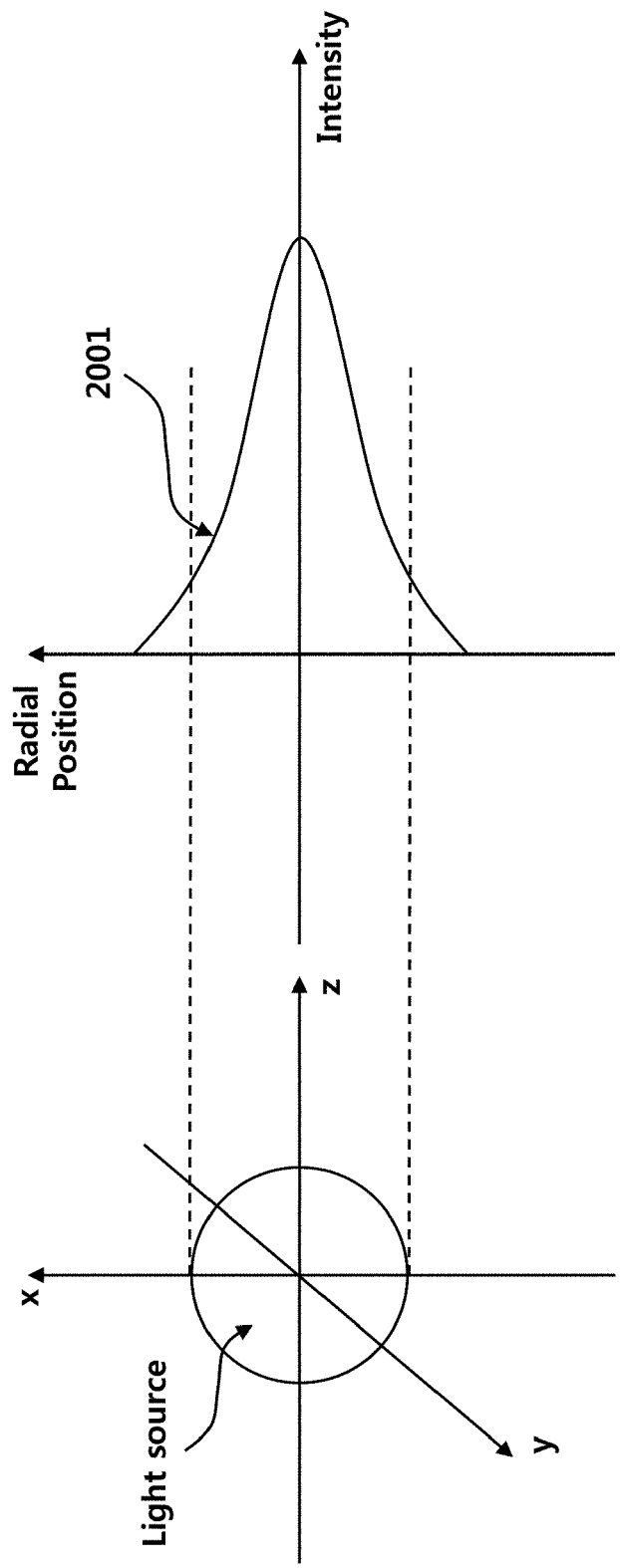
FIG. 27 is a first illustration showing a position-specific intensity of light transferred from a light source module according to one embodiment.

Referring to FIG. 27, the intensity of beams emitted by a single light source element or a plurality of light source elements according to one embodiment may be identified for each position. According to one embodiment, in graph 2000, the strongest intensity of light may be measured at the center portion of a light source, and the decreasing intensity of light may be measured toward the outer periphery of the light source. A detailed correlation may be identified through graph 2001 indicating the intensity of light according to positions.

Graph 2001 indicating the intensity of light according to positions may vary depending on the position or arrangement of a light source in a light output device.

Figure 28:
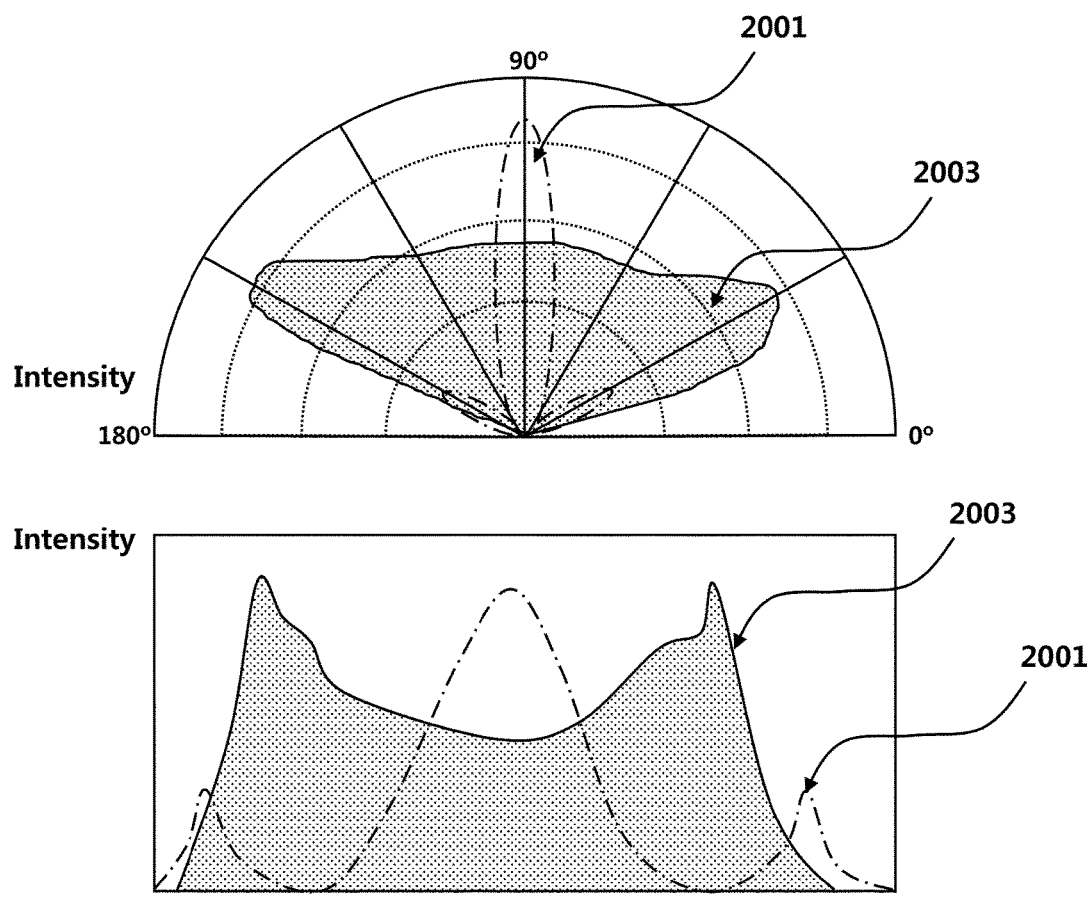
FIG. 28 is a second illustration showing a position-specific intensity of light transferred from a light source module according to one embodiment.
Figure 29:
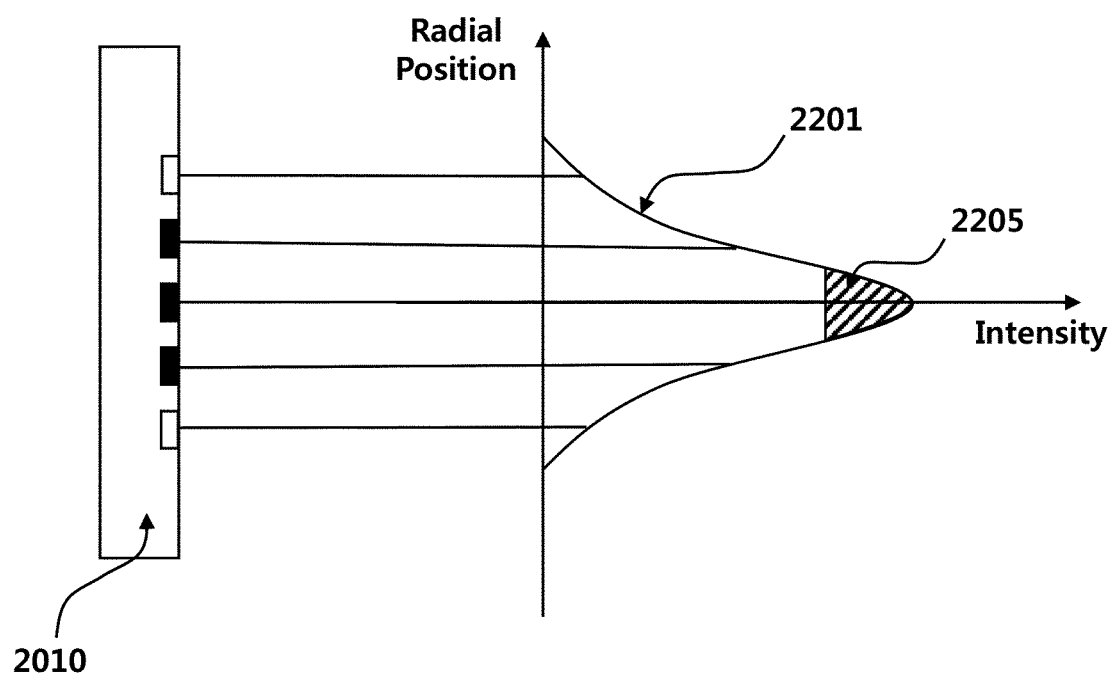
FIG. 29 is a third illustration showing a position-specific intensity of light transferred from a light source module according to one embodiment.

Referring to FIG. 28, the intensity of light emitted by a light source according to one embodiment may be identified according to positions. The intensity 2001 of light emitted by some light source elements may differ from the intensity 2003 of light emitted by other light source elements, and various elements may be controlled or employed to have orientation angles wider than the orientation angles of the light source elements. This may complement a phenomenon in which the intensity of light decreases in the outer peripheral region.

For example, a first light source element or a first light source region at the center portion may be used at a far distance, and a second light source element or a second light source region radiates a beam together with the first light source element or the first light source region, and thus two beams may be complexly radiated.

The targeted intensity or range of light may be defined by appropriately changing or combining the shape of a beam radiated from the first light source element or the first light source region and the shape of a beam radiated from the second light source element or the second light source region According to another embodiment, when an inner region of a light source is divided into a plurality of elements or regions, the shapes of beams radiated from N (N being a natural number equal to or greater than 2) regions may be more precisely controlled. Each of individual elements present in the plurality of regions of the light source may be controlled, and the intensity of output light may be adjusted to a target intensity.

For example, the shapes of complexly radiated beams may be controlled to be flat, and light having a uniform intensity within a predetermined error range may be output.

For example, the first light source element or region at the center portion in graph 2100 may be shown as a Gaussian-shaped or flat-shaped graph.

For example, the second light source element or region at the center portion in graph 2100 may be shown as a bat-shaped graph.

[Calibration of Output Intensity of Light of Transmission Part]

Figure 30:
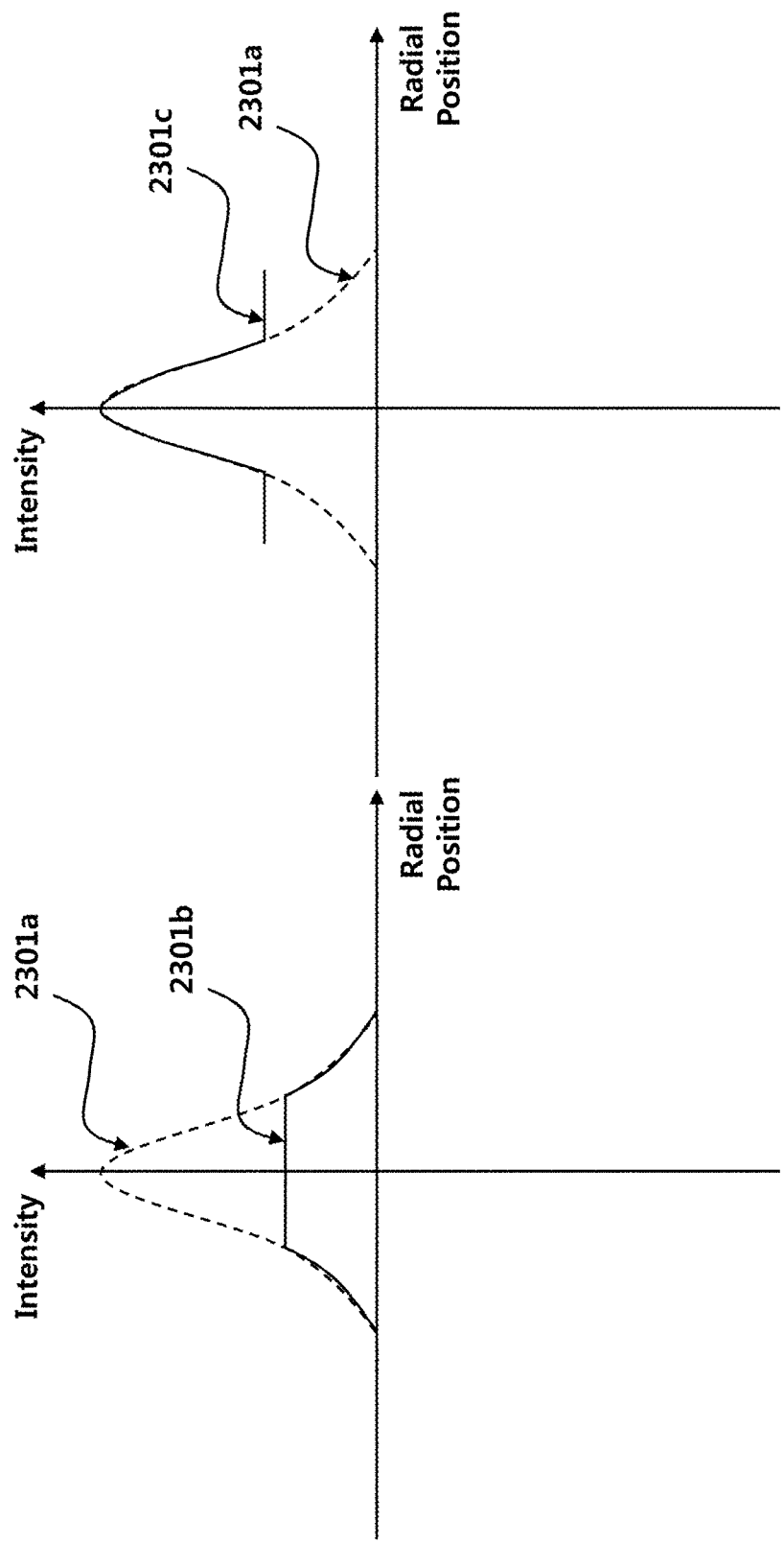
FIG. 30 is a fourth illustration showing a position-specific intensity of light transferred from a light source module according to one embodiment.

Referring to FIGS. 30 and 31, an output of each light source element according to one embodiment may be individually controlled, and an output of a region 2205, in which the intensity of light is strong in graph 2200, may be adjusted.

According to another embodiment, the output may be controlled to change a position-specific light intensity graph 2301a to a graph 2301b, and the position-specific light intensity graph 2301a may be changed to a graph 2301c.

For example, the saturation of the amount of incident charge of a sensor may be prevented by adjusting the center portion of the graph 2301a. In another example, the distance of an object when the object is positioned at a near distance may be accurately calculated by adjusting the peripheral portion of the graph 2301a.

For example, a function for reversing the distribution of the amount of incident charge reflected by a flat surface present at a predetermined distance may be used as a formula to homogenize the distribution of a particular region of the center portion or a boundary portion, thereby calibrating a quantitative depth of an object according to distance.

A beam emitted by the transmission part is reflected by an object, and the reflected beam may be transferred to the reception part. The shape of a graph showing the position-specific intensity of the reflected beam transferred to the reception part may be changed by changing the shape of a graph showing the position-specific intensity of the beam emitted by the transmission part through the above-described transmission calibration.

Referring to FIG. 31, laser beams having a predetermined pulse 2401 are repeatedly generated using a time-of-flight (TOF) method and are emitted to an object. A distance may be measured by calculating the time taken for arrival of a pulse 2402 reflected back by the object. A control device (not shown) may open or close a shutter of a sensor of a reception part. A pulse 2406 is measured by the shutter of the reception part that is opened or closed at the same time a light source of a transmission part is turned on and then turned off. A control unit (not shown) may open or close the shutter of the sensor of the reception part at the time at which the light source of the transmission part is turned off, and, in this case, another pulse 2407 is measured.

A distance of the object may be measured by calculating a partial region 2409 of the pulse 2406.

FIG. 32 is a view for describing a principle in which, in the case of measuring a distance by using the TOF method, the distance is not accurately measured in the reception part.

Referring to FIG. 32, a distance of an object may be measured by calculating a partial region 2409*a* of a pulse 2406*a*.

A pulse 2406*b* is an example of a pulse having a larger amount of charge than the pulse 2406*a*. According to one embodiment, the intensity of emitted light varies according to positions on the object, and thus the intensity of reflected light also varies according to the portions on the object. The intensity of reflected light at the center portion of the object is stronger than that at the peripheral portion thereof. Thus, the amount of charge, which is generated by the reflected light at the center portion and is measured in the reception part, is larger than the amount of charge which is generated by the reflected light at the peripheral portion and is measured in the reception part.

A reference line 2410 indicates a difference c2 between the pulse 2406*a* and the pulse 2406*b*, which is attributed to the relatively strong intensity of received light compared with the case of the pulse 2406*a*.

A pulse 2406*c* is an example of a pulse having a larger amount of charge than the pulse 2406*a*. According to one embodiment, when the intensity of reflected light is larger than a reference value which can be measured by the sensor of the reception part, the amount of charge is saturated in the reception part, and thus the distance of the object may not be accurately measured.

A reference line 2420 indicates a reference value which can be measured by the sensor of the reception part. According to one embodiment, an error occurs in measuring the distance of the object by a difference c4 between the reference value and an actual intensity of reflected light.

[Calibration of Output Intensity of Light Based on Reception Part Feedback]

Figure 33:
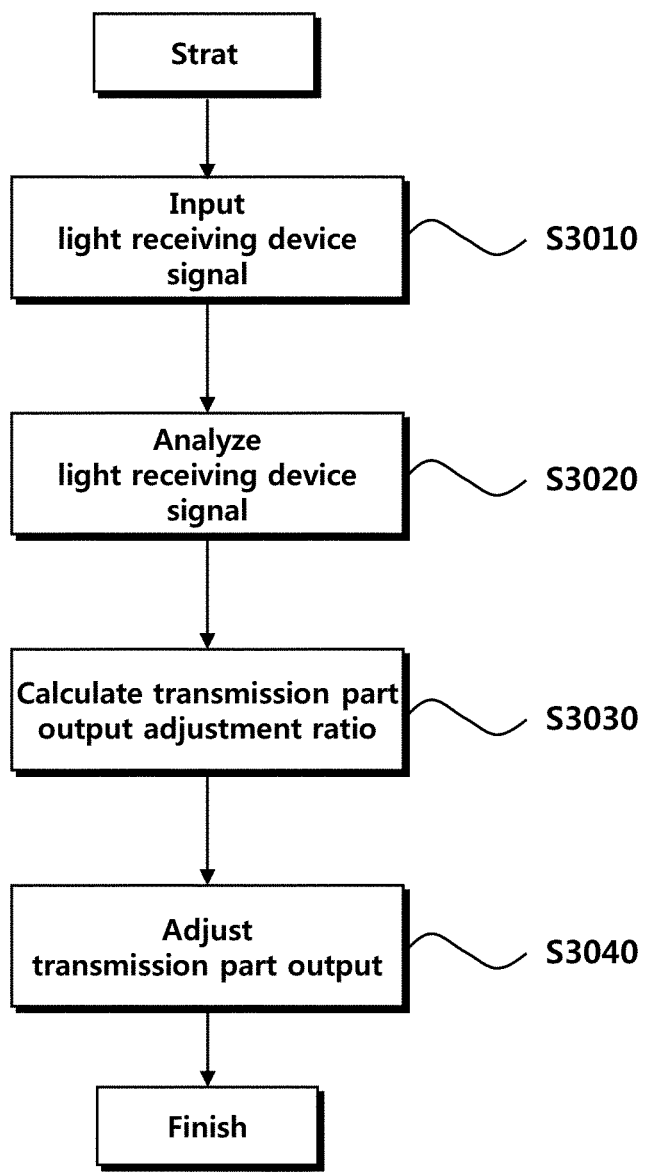
FIG. 33 is a flowchart for describing a method for adjusting output of a light source module.

Referring to FIG. 33, a method 3000 in which a transmission part optimizes light output based on a signal from a reception part according to one embodiment may include a reception part signal input operation (S3010), a reception part signal analysis operation (S3020), a transmission part output adjustment ratio calculation operation (S3030), and a transmission part output adjustment operation (S3040).

In the reception part signal input operation (S3010), data may be input into a control device, based on light received by a reception part. The type of a signal generated based on the light received by the reception part is not limited as long as the signal is capable of indicating the characteristics of light. For example, the type of a signal measured by the reception part may be the amount of charge, current, or reflexibility.

For example, the amount of current generated in the reception part may be defined based on a measured amount of charge. As the amount of charge increases, large current may be generated, and an image date of the reception part may be acquired by calculating the magnitude of current.

In the reception part signal analysis operation (S3020), a signal of the reception part may be input in a control device, and the control device may analyze the signal of the reception part.

In the reception part signal analysis operation (S3020), distance data may be obtained based on the amount of charge or current data of the reception part.

In a reception part saturation determination operation (not shown), the control device may determine whether, when the signal of the reception part is the amount of charge, the amount of charge is saturated. In order to adjust output of a light source element within a saturation range of the reception part, the control device may first determine whether the amount of charge is saturated.

In the transmission part output adjustment ratio calculation operation (S3030), the control device may derive a function based on the distribution of the amount of incident charge. The output adjustment ratio may be set as a ratio for making the distribution of output uniform.

For example, a function for reversing the distribution of the amount of incident charge reflected by a flat surface present at a predetermined distance may be used as a formula to homogenize the distribution of a particular region of the center portion or a boundary portion, thereby calibrating a quantitative depth of an object according to distance.

Further, in the transmission part output adjustment ratio calculation operation (S3030 output of the transmission part may be), uniformly adjusted for a partial region of a light source.

In transmission output adjustment ratio calculation operation (S3040), the control device may adjust output of a predetermined region of the light source according to the ratio calculated in the transmission part output adjustment ratio calculation operation (S3030). For example, in a light source module, the output of the predetermined region may have a predetermined intensity or a uniform intensity.

Further, in the transmission part output adjustment operation (S3040), the output of the transmission part may be adjusted by adjusting the output of a light source element of the light source.

In the transmission part output adjustment operation (S3040), an output adjustment ratio may be calculated based on a signal from the reception part or a signal in the transmission part.

When a signal of the transmission part is adjusted based on data obtained based on a signal of the reception part, a feed-back structure may be formed.

5.2 Calibration of Receiving Module

[Adjustment of Intensity of Signal Input to Reception Part]

In a method for calibrating a reception signal of a receiving module according to one embodiment, a signal input to a reception part may be adjusted based on a predetermined reference. The predetermined reference may be differently defined according to, for example, a recognition range of a sensor disposed in the reception part.

For example, the signal input to the reception part may adjust the intensity of a signal of the reception part by calibrating a difference of the light amount or refractive index of the outer periphery of a lens. According to one embodiment, in a concave lens or convex lens, the intensity of transferred light varies according to positions at the lens, and thus the input signal of the reception part may calibrate the difference of the refractive index or light amount of the outer periphery of the lens. According to another embodiment, the amount of light decreases toward the outer periphery of a lens, and the reception part may recognize a signal input thereto as a signal having a larger intensity than an actual received signal. It is possible to make the intensity of the transmission part increase toward the outer periphery of a lens, but a signal of the reception part may be simply adjusted by adjusting the signal in the reception part.

According to one embodiment, the reception part may calibrate and recognize a signal such that the sensor of the reception part is not saturated. According to one embodiment, light actually received by the reception part may be light having a strong intensity beyond the saturation range of the reception part. Apart from the intensity of the actually received light, the reception part may calibrate and recognize a signal such that the sensor of the reception part is not saturated. Such calibration may simply control saturation, and may thus facilitate use of an image sensor or various types of sensors.

According to one embodiment, the reception part may individually adjust the intensity of a signal input thereto according to predetermined regions of the sensor of the reception part. According to one embodiment, light emitted by the transmission part may have a radial shape in which the intensity of the light decreases from the center portion to the outer periphery. In relation to the intensity of light, the intensity of light at the center portion may be reduced, or the intensity of light at the outer peripheral portion may be increased. For example, a region is divided into a far region and a near region, and then only the intensity of light at the center portion corresponding to the far region may be uniformly adjusted. For example, a region is divided into a far region and a near region, and then only the intensity of light at the outer peripheral portion corresponding to the near region may be uniformly adjusted.

According to one embodiment, the intensity of a signal input to the reception part may be adjusted with reference to remaining areas other than the boundary portion. According to one embodiment, when a region is divided into a far region and a near region and then light is emitted, noise may be generated in a signal of a boundary portion therebetween. In this case, the resolution of a sensor may be reduced, and thus accurate distance measurement may not be performed. Therefore, the intensity of a signal input to the reception part may be adjusted with reference to remaining regions other than the boundary portion.

For example, in relation to the intensity of a signal input to the reception part, the intensity of the signal at the boundary portion may be calculated by averaging the intensities of the signal in the remaining regions other than the boundary portion. In this case, the intensity of a signal at the boundary portion is accurately calculated by averaging the intensities of a signal of the remaining regions other than the boundary portion, and thus noise is reduced and the resolution of the sensor is increased. Further, through such calibration, a light output device can accurately measure a distance.

[Beam Radiation Angle Calibration According to Change in Signal Input to Reception Part]

According to one embodiment, in near-distance mode, a high-density spot beam in far-distance mode has large-area homogeneity by adjusting the working distance, and a function of acquiring depth distance information at a relative near distance may be implemented by reducing the intensity of light.

On the basis of a beam change according to a change in input current of the vertical cavity surface-emitting laser (VCSEL), beam divergence distribution, which changes according to a change in the x-axis direction or the y-axis direction, may be measured.

The position of the driving body may be adjusted according to a change in beam divergence by input current of the light source part. The field of view in which a beam is projected on the large-area subject may change in proportion to the beam divergence of an aperture, and may have a predetermined correlation with the beam divergence. For example, the amount of a change in the field of view in which a beam is projected on the subject is in proportion to the amount of a change in the beam divergence of an aperture, and thus the radiation angle of light emitted from the light source part may be more precisely controlled by calculating the amount of each change.

According to one embodiment, a change in the beam divergence of an aperture may be measured based on a change in input current of the light source part of the light source module. A working distance may be adjusted by calculating the amount of a change in the beam divergence.

According to one embodiment, control may be performed by measuring or predicting the amount of a change in a beam divergence of an aperture according to a change in input current and thereby optimizing information regarding a field of view at which light reaches a subject.

According to another embodiment, control may be performed by measuring or predicting the amount of a change in a beam divergence of the aperture according to the temperature of external air or the like and thereby optimizing information regarding a field of view at which light reaches the subject.

By using information about beam divergence in the transmission part and the field of view at which light reaches the subject, it is possible to consider the intensity of light from the transmission part and control the amount of light reaching a sensor of the reception part.

According to one embodiment, when the beam divergence is adjusted by adjusting the working distance, the intensity or density of light projected on a large area of the subject may be adjusted, and thus the saturation of the sensor of the reception part may be prevented.

More excellent distance measurement data may be acquired by performing calibration using the above data.

The beam divergence may be defined according to the shape or profile of a beam.

5.3 Light Source Module Calibration Using Photodetector

According to one embodiment, in order to detect the movement or position of an optical device according to the movement of an actuator, a light source module may include a photodetector.

The photodetector may receive light emitted from a light source element, and may sense a change in a current value. The photodetector may detect, based on the change in the current value, the movement or position of the light source module.

The photodetector may control, based on the change in the current value, the movement of the actuator through a control device or a processor.

The movement or position of the actuator or the optical device, which can optimize the performance of the light source module, may be calculated based on data measured by the photodetector according to one embodiment.

The position of the actuator or the optical device may be calibrated based on data of the photodetector, and, for the calibration, data measured by the photodetector in the past may be used as necessary to optimize the light source module.

According to one embodiment, when the light source module includes a plurality of light source elements or a light source element includes a plurality of regions, the photodetector may be used to increase precision of the light output of the light source element. The position or stoke of the optical device may be determined based on input current transferred through a coil in the actuator. In this case, the photodetector may optimize/control the light source module through a repeated feedback process of measuring and calibrating a current change in the actuator.

According to one embodiment, the position of the optical device may be measured by measuring the intensity of electromagnetic force which is generated in an electromagnet by a hall integrated circuit (Hall IC), but may be measured by measuring intensity of current using the photodetector.

The determination by the photodetector on the movement or position of the optical device may be applied both to a voice coil motor (VCM)-type movement and to an optical image stabilization (OIS)-type movement.

For example, depending on the position of a carrier including a movable lens, the amount of reflected light may vary and a value of current sensed by the photodetector varies, and thus position measurement and position control through the photodetector are possible.

What is claimed is:

1. A light source module comprising:
    a light source comprising a plurality of light source elements; and
    an optical device through which light emitted by the light source passes,
    wherein the optical device is divided into a plurality of regions, at least one micro-lens array (MLA) is disposed in each of the plurality of regions, the light source elements of the light source respectively comprise independent regions, light transferred from the independent regions of the light source elements passes through the optical device and has individual fields of view (FOV), and the intensity of the light transferred from the light source elements is adjustable,
    wherein a number of the plurality of light source elements to be turned on in a near-distance mode and a far-distance mode are different.

2. The light source module of claim 1, wherein:
    the optical device comprises a first optical device and a second optical device;
    the first optical device makes light, emitted by the light source, pass, is connected to a first support, and is divided into N (N being a natural number equal to or greater than 1) regions;
    a body encloses the first optical device;
    the body comprises a coil, a piezoelectric element, or a rotating device;
    the first optical device comprises a magnet or a metal material configured to interact with the body so as to cause a movement of the first optical device in a light path direction or in a direction perpendicular to or parallel to a light path;
    the movement of the first optical device by the interaction with the body allows adjusting a radiation angle or a direction of light; and
    the light source is configured to receive a control signal and individually adjust outputs of the light source elements using the control signal.

3. The light source module of claim 1, wherein the light source elements are connected to a substrate by using a flip-type chip or by a wire connection of the light emission surface so that power is supplied, wherein, in a flip-chip, there is no wire and wire connection pad on a light emission surface so that a light source arrangement area can be minimized.

4. The light source module of claim 1, wherein the at least one micro-lens array comprises a micro-lens formed to be asymmetrical.

5. The light source module of claim 1, wherein the at least one micro-lens array comprises a micro-lens formed to be symmetrical.

6. The light source module of claim 1, wherein the at least one micro-lens array is formed to have different refractive indexes for regions.

7. The light source module of claim 1, wherein the at least one micro-lens array is arranged to transfer light in accordance with a movement in a predetermined order of the optical device.

8. The light source module of claim 1, wherein the light source elements are all turned on in the near-distance mode, and only light source elements placed in some regions are turned on in the far-distance mode.

9. The light source module of claim 8, wherein the light source elements reduce an intensity of a light output in the near-distance mode.

10. The light source module of claim 8, wherein the light source elements increase an intensity of a light output in the far-distance mode, and the intensity of the light output is adjusted in accordance with a reference predetermined based on a distance of a target object.

11. The light source module of claim 8, wherein the plurality of light source elements sequentially operate.

12. The light source module of claim 1, wherein the light source elements are all turned on in the far-distance mode, and only light source elements placed in some regions among the light source elements are turned on in the near-distance mode.

13. A method for operating a light source module comprising a light source comprising a plurality of light source elements and an optical device through which light emitted by the light source passes, the method comprising:
    setting an operation mode of the light source module; and
    adjusting intensities of the plurality of light source elements according to the operation mode,
    wherein the operation mode is a near-distance mode, only some of the plurality of light source elements operate, and an intensity of a current to be input is adjusted in order to adjust intensities of the plurality of light source elements,
    wherein the optical device is divided into a plurality of regions, at least one micro-lens array (MLA) is disposed in each of the plurality of regions, the light source elements of the light source respectively comprise independent regions, light transferred from the independent regions of the light source elements passes through the optical device and has individual fields of view (FOV), and the intensity of the light transferred from the light source elements is adjustable.

14. A method for operating a light source module comprising a light source comprising a plurality of light source elements and an optical device through which light emitted by the light source passes, the method comprising:
    setting an operation mode of the light source module; and
    adjusting intensities of the plurality of light source elements according to the operation mode,
    wherein the operation mode is a far-distance mode, and the plurality of light source elements operate according to a predetermined rule, wherein the optical device is divided into a plurality of regions, at least one micro-lens array (MLA) is disposed in each of the plurality of regions, the light source elements of the light source respectively comprise independent regions, light transferred from the independent regions of the light source elements passes through the optical device and has individual fields of view (FOV), and the intensity of the light transferred from the light source elements is adjustable.

15. A method for operating the light source module of claim 1, the method comprising:
   setting an operation mode of the light source module; and
   controlling a movement of the optical device according to the operation mode.

16. The method of claim 15, wherein the light source module is configured to move in a direction of an optical axis or in a direction perpendicular to or parallel to the optical axis, or to rotate about the optical axis.

17. The light source module of claim 1, further comprising a photodetector configured to measure an intensity of light passing through a lens, wherein the photodetector is configured to determine whether the light source elements operate normally, based on the measured intensity of light.

18. The light source module of claim 1, further comprising a plurality of pogo pin tensions connected to a substrate and configured to adjust a tension of an internal spring according to an intensity of a current, wherein a beam transmission direction is adjusted by the movement of the pogo pin tensions.

* * * * *